United States Patent
Inaba

(10) Patent No.: US 7,813,159 B2
(45) Date of Patent: Oct. 12, 2010

(54) SEMICONDUCTOR MEMORY DEVICE AND DATA WRITE AND READ METHODS OF THE SAME

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 464 days.

(21) Appl. No.: 12/032,135

(22) Filed: Feb. 15, 2008

(65) Prior Publication Data

US 2008/0205124 A1 Aug. 28, 2008

(30) Foreign Application Priority Data

Feb. 15, 2007 (JP) ............... 2007-035354

(51) Int. Cl.
*G11C 11/00* (2006.01)
(52) U.S. Cl. .................. 365/148; 365/66; 365/158; 365/171
(58) Field of Classification Search .......... 365/148, 365/158, 171, 66
See application file for complete search history.

(56) References Cited

U.S. PATENT DOCUMENTS

| | | | |
|---|---|---|---|
| 5,695,864 A | 12/1997 | Slonczewski | |
| 6,055,178 A * | 4/2000 | Naji | 365/158 |
| 6,909,129 B2 | 6/2005 | Kim et al. | |
| 6,914,808 B2 * | 7/2005 | Inaba | 365/158 |
| 6,944,048 B2 | 9/2005 | Iwata | |
| 7,379,327 B2 * | 5/2008 | Chen et al. | 365/158 |
| 2004/0141368 A1 | 7/2004 | Inaba | |
| 2007/0206406 A1 | 9/2007 | Ueda et al. | |
| 2009/0014703 A1 | 1/2009 | Inaba | |

FOREIGN PATENT DOCUMENTS

JP 2005-310829 11/2005

OTHER PUBLICATIONS

M. Hosomi, et al., "A Nonvolatile Memory with Spin Torque Transfer Magnetization Switching: Spin-RAM", IEEE IEDM Technical Digest, Dec. 2005, 4 Pages.

* cited by examiner

*Primary Examiner*—Pho M Luu
*Assistant Examiner*—Tha-O Bui
(74) *Attorney, Agent, or Firm*—Oblon, Spivak, McClelland, Maier & Neustadt, L.L.P.

(57) ABSTRACT

A semiconductor memory device includes first to third resistive memory elements, a first transistor having a first gate electrode, first and second source/drain electrodes, the first source/drain electrode being connected to one terminal of the first resistive memory element, and the second source/drain electrode being connected to one terminal of the third resistive memory element, a second transistor having a second gate electrode, third and fourth source/drain electrodes, the third source/drain electrode being connected to one terminal of the second resistive memory element, and the fourth source/drain electrode being connected to one terminal of the third resistive memory element, a first bit line connected to the other terminal of the third resistive memory element, a second bit line connected to the other terminal of each of the first and second resistive memory elements, and first and second word lines connected to each of the first and second gate electrodes.

20 Claims, 12 Drawing Sheets

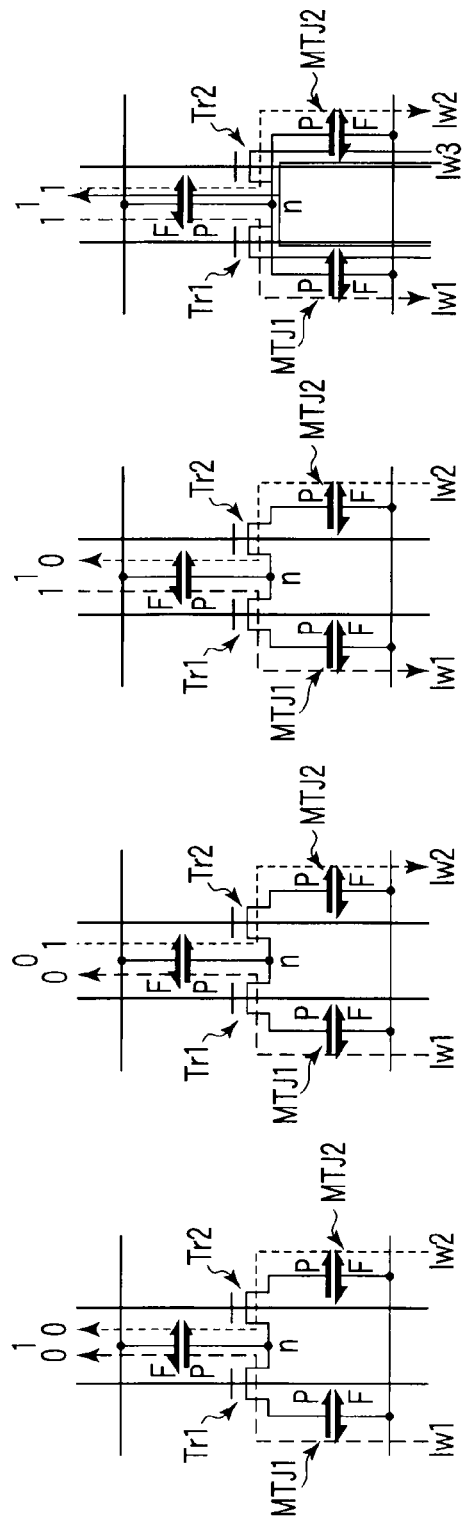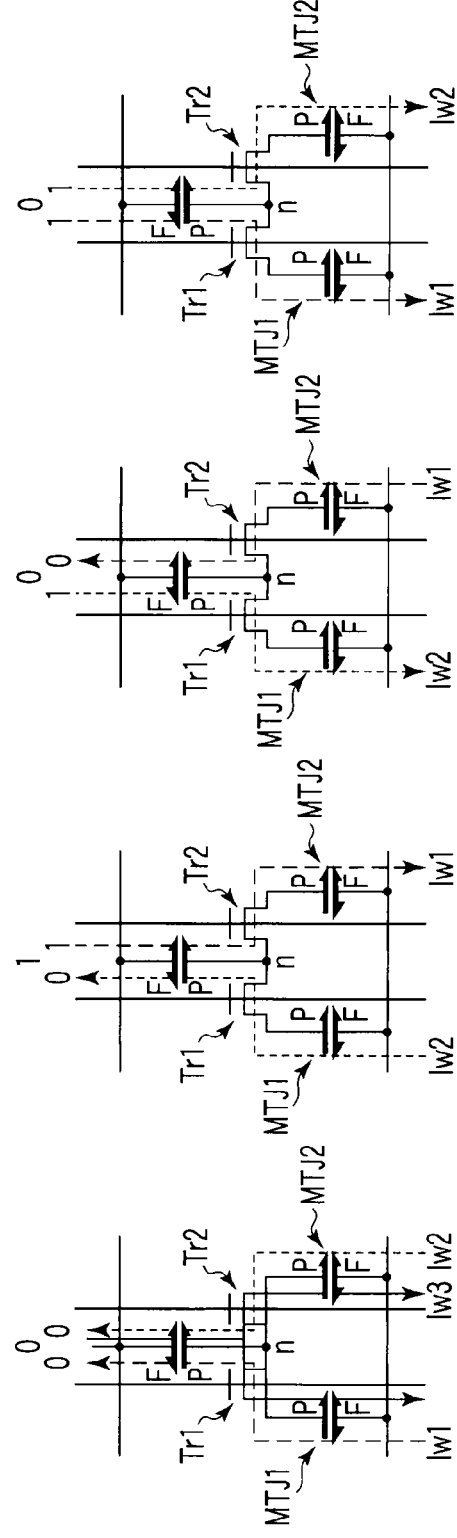

– – –► Direction of electric current Iw1 in first write operation
------► Direction of electric current Iw2 in second write operation – – –▶ Direction of electric current Iw1 in first write operation
- - - -▶ Direction of electric current Iw2 in second write operation

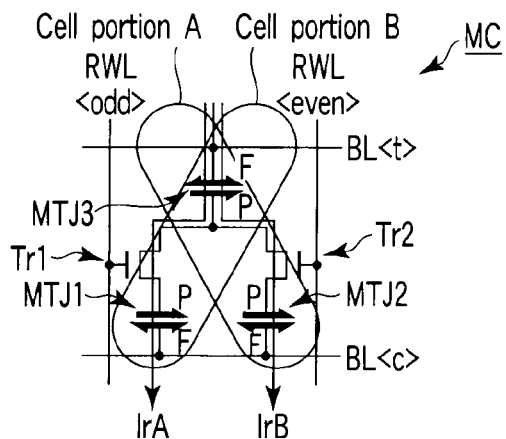
F I G. 11
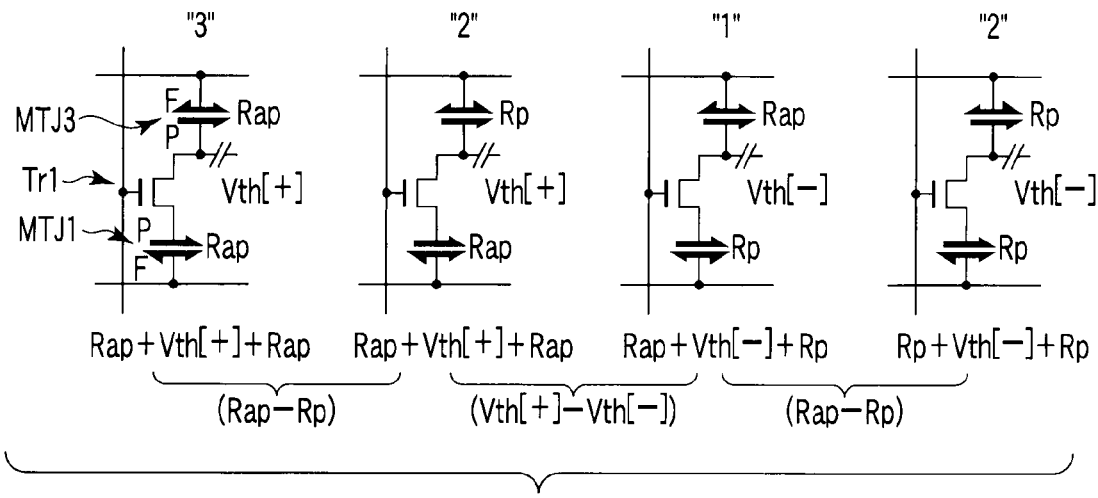
F I G. 12
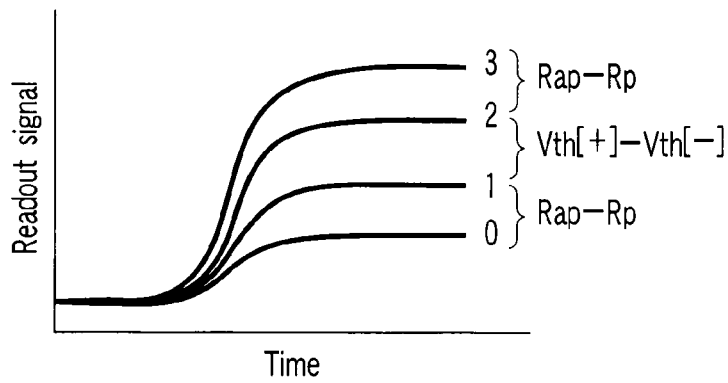
F I G. 13

Rp···high-resistance state (data "0")
Rap···low-resistance state (data "1")

SEMICONDUCTOR MEMORY DEVICE AND DATA WRITE AND READ METHODS OF THE SAME

CROSS-REFERENCE TO RELATED APPLICATIONS

This application is based upon and claims the benefit of priority from prior Japanese Patent Application No. 2007-035354, filed Feb. 15, 2007, the entire contents of which are incorporated herein by reference.

BACKGROUND OF THE INVENTION

1. Field of the Invention

The present invention relates to a semiconductor memory device which uses a resistive memory element as a memory cell and writes information by using an electric current flowing through the resistive memory element and, more particularly, to a semiconductor memory device in which a memory cell unit comprises two transistors and three resistive memory elements, and data write and read methods of the same.

2. Description of the Related Art

Recently, semiconductor memories such as a PRAM (Phase change Random Access Memory) and MRAM (Magnetoresistive Random Access Memory) using resistive elements as memory elements are attracting attention and developed. The former is a semiconductor memory that stores information by changing the resistance value of a resistive memory element by changing the phase of the crystal structure of the element by supplying a write current to it. The latter is a semiconductor memory that uses, as a memory element, a magnetoresistive element having a structure called an MTJ (Magnetic Tunnel Junction) in which two ferromagnetic materials sandwich an insulating film, the magnetization direction in one ferromagnetic layer (a fixed layer) is fixed, and the magnetization direction in the other ferromagnetic layer (a recording layer) is reversible. This semiconductor memory stores information by using a so-called magnetoresistive effect by which the resistance value changes in accordance with relative magnetization directions in the recording layer and fixed layer. In particular, the MRAM has the characteristics that it is nonvolatile, can operate at a high speed, can be highly integrated, and has high reliability. Therefore, the MRAM is expected and developed as a memory device capable of replacing the SRAM, PSRAM (Pseudo SRAM), DRAM, and the like.

Conventionally, a so-called current-induced magnetic field write method that reverses the magnetization direction in the recording layer by a magnetic field induced by an electric current flowing through a write line is the general write method of the MRAM. On the other hand, a so-called spin injection MRAM using magnetization reversal caused by polarized spin current injection is recently attracting attention (e.g., patent reference 1 and non-patent reference 1). In this method, the density of an electric current flowing through a magnetoresistive element defines a current amount (reversing threshold current) necessary for spin injection magnetization reversal. Accordingly, the reversing threshold current amount reduces as the area of the magnetoresistive element reduces. That is, the method is expected as a technique capable of implementing a gigabit-class MRAM since the reversing threshold current is also scaled.

The write operation of the spin injection MRAM is performed by supplying a write current equal to or larger than the reversing threshold current to the magnetoresistive element, and the direction of the write current flowing through the magnetoresistive element determines the polarity of data to be written. The read operation is performed by reading out the bit line potential by supplying a constant electric current to the magnetoresistive element, or reading out an electric current flowing through the magnetoresistive element by applying a constant voltage, as in the conventional current-induced magnetic field write type MRAM. That is, a memory cell of the spin injection MRAM requires no write word line that is necessary in the conventional current-induced magnetic field write type MRAM. In a general 1Tr+1MTJ memory cell, for example, one terminal of the MTJ element is connected to a first bit line, the other terminal of the MTJ element is connected to one source/drain electrode of a transistor, the other source/drain electrode of the transistor is connected to a second bit line, and the gate electrode of the transistor is connected to a word line. In this case, the memory cell size is $8F^2$ (F is a minimum feature size).

On the other hand, a RAM that is presently most widely used is a DRAM. In order for the MRAM to replace this DRAM, the chip fabrication cost, i.e., the chip area of the MRAM must be equal to or smaller than that of the DRAM (the cell size of a general DRAM is $8F^2$). Generally, decreasing the cell size of a memory cell accounting for a high ratio in the chip area of a semiconductor memory is most effective to decrease the chip size of the semiconductor memory. To implement a low-cost spin injection MRAM, therefore, the cell size must be made smaller than that ($8F^2$) of the DRAM. However, the cell size of the conventional spin injection MRAM is $8F^2$, i.e., equal to that of the DRAM as described above.

[Patent Reference 1] U.S. Pat. No. 5,695,864

[Non-patent Reference 1] 2005 IEDM Technical Digest, pp. 459-462, December 2005

BRIEF SUMMARY OF THE INVENTION

A semiconductor memory device according to the first aspect of the present invention comprising a first resistive memory element, a second resistive memory element, and a third resistive memory element forming a first memory cell; a first transistor having a first gate electrode, a first source/drain electrode, and a second source/drain electrode, the first source/drain electrode being connected to one terminal of the first resistive memory element, and the second source/drain electrode being connected to one terminal of the third resistive memory element; a second transistor having a second gate electrode, a third source/drain electrode, and a fourth source/drain electrode, the third source/drain electrode being connected to one terminal of the second resistive memory element, and the fourth source/drain electrode being connected to one terminal of the third resistive memory element; a first bit line connected to the other terminal of the third resistive memory element; a second bit line connected to the other terminal of each of the first resistive memory element and the second resistive memory element; a first word line connected to the first gate electrode; and a second word line connected to the second gate electrode.

A data write method of a semiconductor memory device according to the second aspect of the present invention including a first resistive memory element, a second resistive memory element, and a third resistive memory element forming a first memory cell; a first transistor having a first gate electrode, a first source/drain electrode, and a second source/drain electrode, the first source/drain electrode being connected to one terminal of the first resistive memory element, and the second source/drain electrode being connected to one terminal of the third resistive memory element; a second transistor having a second gate electrode, a third source/drain electrode, and a fourth source/drain electrode, the third source/drain electrode being connected to one terminal of the second resistive memory element, and the fourth source/drain electrode being connected to one terminal of the third resistive memory element; a first bit line connected to the other terminal of the third resistive memory element; a second bit line connected to the other terminal of each of the first resistive memory element and the second resistive memory element; a first word line connected to the first gate electrode; and a second word line connected to the second gate electrode, and the data write method comprising a first write operation of supplying a first write current to the first resistive memory element and the third resistive memory element by turning on the first transistor, and simultaneously writing data corresponding to a direction of the first write current in the first resistive memory element and the third resistive memory element; and a second write operation of supplying a second write current to the second resistive memory element and the third resistive memory element by turning on the second transistor, and simultaneously writing data corresponding to a direction of the second write current in the second resistive memory element and the third resistive memory element.

A data read method of a semiconductor memory device according to the third aspect of the present invention including a first resistive memory element, a second resistive memory element, and a third resistive memory element forming a first memory cell; a first transistor having a first gate electrode, a first source/drain electrode, and a second source/drain electrode, the first source/drain electrode being connected to one terminal of the first resistive memory element, and the second source/drain electrode being connected to one terminal of the third resistive memory element; a second transistor having a second gate electrode, a third source/drain electrode, and a fourth source/drain electrode, the third source/drain electrode being connected to one terminal of the second resistive memory element, and the fourth source/drain electrode being connected to one terminal of the third resistive memory element; a first bit line connected to the other terminal of the third resistive memory element; a second bit line connected to the other terminal of each of the first resistive memory element and the second resistive memory element; a first word line connected to the first gate electrode; a second word line connected to the second gate electrode; and a read circuit connected to one of the first bit line and the second bit line, and the data read method comprising a first read operation of simultaneously reading out data from the first resistive memory element and the third resistive memory element by activating the first word line; and a second read operation of simultaneously reading out data from the second resistive memory element and the third resistive memory element by activating the second word line.

BRIEF DESCRIPTION OF THE SEVERAL VIEWS OF THE DRAWING

FIGS. 8A to 8H are views for explaining practical example 1 of the write method of the memory cell according to the embodiment of the present invention;

FIG. 11 is a view for explaining an outline of the read operation of the magnetic random access memory according to the embodiment of the present invention;

FIG. 12 is a view for explaining a data discrimination method in the read operation of the memory cell according to the embodiment of the present invention;

FIG. 13 is a waveform chart of read signals in states "0" to "3" of the read operation according to the embodiment of the present invention;

DETAILED DESCRIPTION OF THE INVENTION

Figure 1:
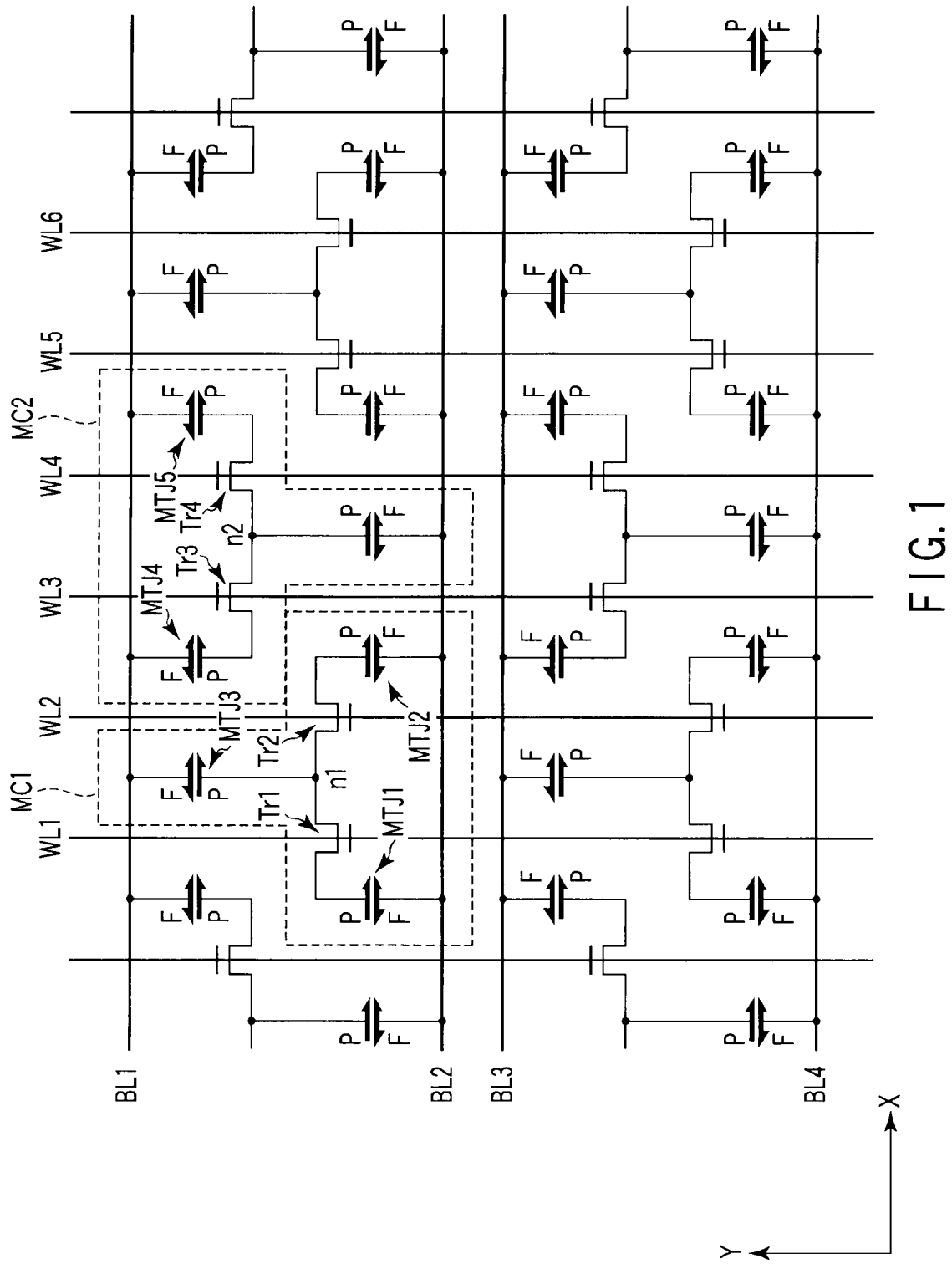
FIG. 1 is an equivalent circuit diagram of a memory cell of a magnetic random access memory according to an embodiment of the present invention.

An embodiment of the present invention will be explained below with reference to the accompanying drawing. In this explanation, the same reference numerals denote the same parts throughout the drawing.

Note that in the following embodiment, a magnetic random access memory will be taken as an example of a semiconductor memory device, and an MTJ element (magnetoresistive effect element) will be used as a resistive memory element.

[1] Memory Cell

[1-1] Circuit Configuration

FIG. 1 is an equivalent circuit diagram of a memory cell of a magnetic random access memory according to an embodiment of the present invention. In FIG. 1, a symbol composed of a one-headed arrow and two-headed arrow represents an MTJ element. The one-headed arrow indicates a fixed layer, and the two-headed arrow indicates a recording layer. The meaning of this symbol similarly applies to other figures. The circuit configuration of the memory cell of the magnetic random access memory according to the embodiment of the present invention will be explained below.

As shown in FIG. 1, a memory cell MC1 comprises two transistors Tr1 and Tr2 and three MTJ elements MTJ1, MTJ2, and MTJ3.

The current path (source/drain electrode) of the first transistor Tr1 has one end connected to one terminal of the first MTJ element MTJ1, and the other end connected to a node n1. A first word line WL1 is connected to the gate of the first transistor Tr1.

The current path of the second transistor Tr2 has one end connected to one terminal of the second MTJ element MTJ2, and the other end connected to the node n1. A second word line WL2 is connected to the gate of the second transistor Tr2.

The other terminal of each of the first and second MTJ elements MTJ1 and MTJ2 is connected to a second bit line BL2. The third MTJ element MTJ3 has one terminal connected to the node n1, and the other terminal connected to a first bit line BL1.

The MTJ elements MTJ1, MTJ2, and MTJ3 each comprise a fixed layer (pinned layer) P in which the magnetization direction is fixed, a recording layer (free layer) F in which the magnetization direction is variable, and an insulating layer (nonmagnetic layer) formed between the fixed layer and recording layer.

The first MTJ element MTJ1 has the fixed layer P connected to one end of the current path of the first transistor Tr1, and the recording layer F connected to the second bit line BL2. The second MTJ element MTJ2 has the fixed layer P connected to one end of the current path of the second transistor Tr2, and the recording layer F connected to the second bit line BL2. The third MTJ element MTJ3 has the fixed layer P connected to the other end of the current path of each of the first and second transistors Tr1 and Tr2, and the recording layer F connected to the first bit line BL1.

Note that in FIG. 1, all the recording layers F of the MTJ elements MTJ1, MTJ2, and MTJ3 are connected to the bit lines, and all the fixed layers P of the MTJ elements MTJ1, MTJ2, and MTJ3 are connected to the source/drain electrodes of the transistors Tr1 and Tr2. However, the connections of the fixed layers P and recording layers F of the MTJ elements MTJ1, MTJ2, and MTJ3 to the transistors Tr1 and Tr2 are not limited to those shown in FIG. 1. For example, it is also possible to connect all the fixed layers P of the MTJ elements MTJ1, MTJ2, and MTJ3 to the bit lines, and all the recording layers F of the MTJ elements MTJ1, MTJ2, and MTJ3 to the source/drain electrodes of the transistors Tr1 and Tr2, or connect the fixed layer P of only the third MTJ element MTJ3 to the first bit line BL1, and the recording layer F of only the third MTJ element MTJ3 to the other end of the current path of each of the first and second transistors Tr1 and Tr2.

Although the memory cell MC1 and a memory cell MC2 adjacent to each other in the X direction are connected to the paired bit lines BL1 and BL2, the connections to the bit lines BL1 and BL2 are opposite. That is, while the common node n1 is connected to the first bit line BL1 in the memory cell MC1, a common node n2 is connected to the second bit line BL2 in the memory cell MC2. Thus, the memory cells MC1 and MC2 adjacent to each other in the X direction have a mirror-image relationship. The mirror-image relationship means a relationship in which adjacent cell groups are axially symmetrical with respect to the direction (X direction) in which the bit lines BL run, or a relationship in which adjacent cell groups are relatively inverted in the Y direction.

[1-2] Layout and Sectional Structure

Figure 2:
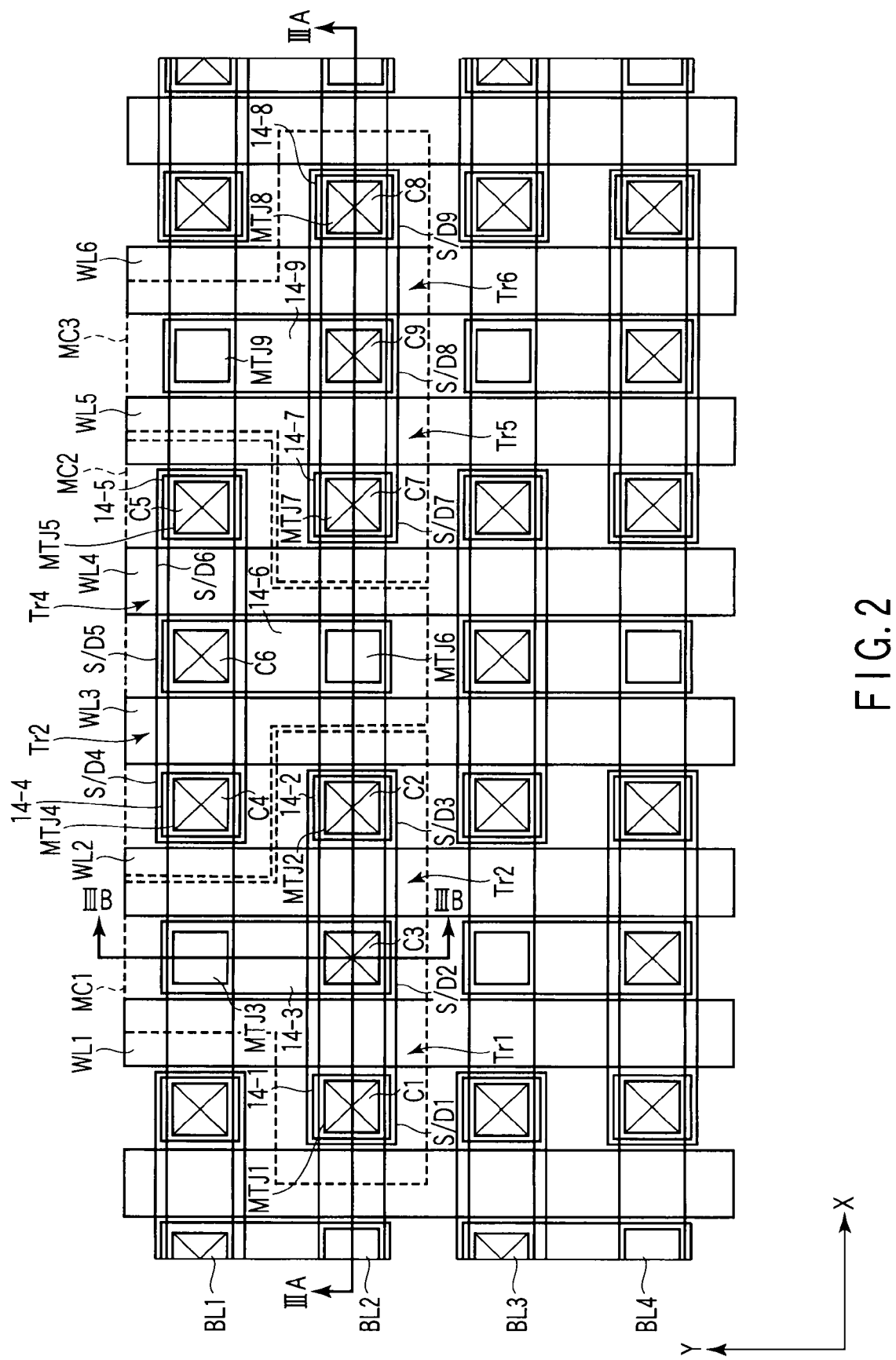
FIG. 2 is a view showing the layout of the memory cell of the magnetic random access memory according to the embodiment of the present invention.
Figure 3A:
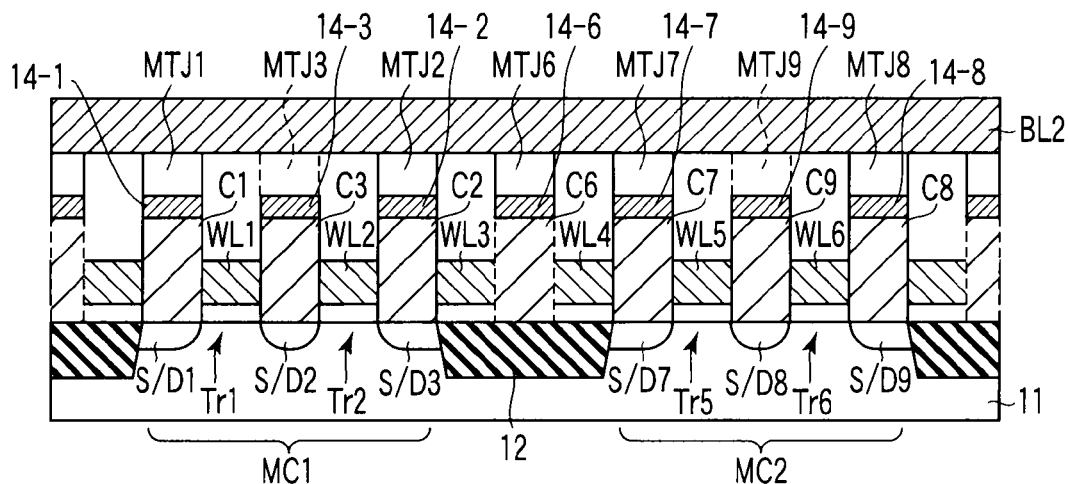
FIG. 3A is a sectional view taken along a line IIIA-IIIA in FIG. 2.
Figure 3B:
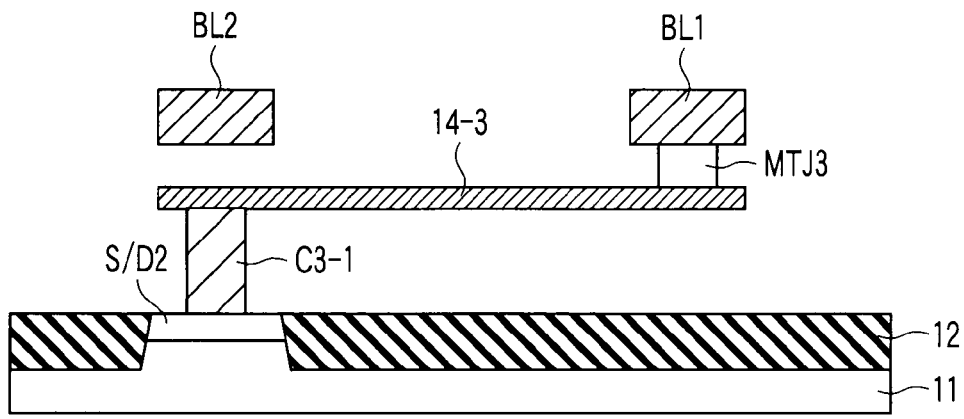
FIG. 3B is a sectional view taken along a line IIIB-IIIB in FIG. 2.

FIG. 2 is a view showing the layout of the memory cell of the magnetic random access memory according to the embodiment of the present invention. FIG. 3A is a sectional view taken along a line IIIA-IIIA in FIG. 2. FIG. 3B is a sectional view taken along a line IIIB-IIIB in FIG. 2. The layout and sectional structure of the memory cell of the magnetic random access memory according to the embodiment of the present invention will be explained below.

As shown in FIGS. 2, 3A, and 3B, the first and second bit lines BL1 and BL2 adjacent to each other are formed by the same interconnection layer, and run in the same direction (in this embodiment, the X direction). The first and second word lines WL1 and WL2 adjacent to each other are formed by the same interconnection layer, and run in the direction (in this embodiment, the Y direction) perpendicular to the first and second bit lines BL1 and BL2.

The first and second MTJ elements MTJ1 and MTJ2 are formed below the second bit line BL2. The first and second word lines WL1 and WL2 exist between the first and second MTJ elements MTJ1 and MTJ2. Lower electrode layers 14-1 and 14-2 are formed below the first and second MTJ elements MTJ1 and MTJ2.

The third MTJ element MTJ3 is formed below the first bit line BL1. A lower electrode layer 14-3 is formed below the third MTJ element MTJ3. The lower electrode layer 14-3 extends from a portion below the first bit line BL1 to a portion below the second bit line BL2 in the direction (in this embodiment, the Y direction) in which the word lines WL1 and WL2 run.

The first transistor Tr1 is formed below the second bit line BL2. The first transistor Tr1 has a first gate electrode, first source/drain diffusion layer S/D1, and second source/drain diffusion layer S/D2. The first gate electrode is made of the first word line WL1. The first and second source/drain diffusion layers S/D1 and S/D2 are formed below the second bit line BL2 so as to sandwich the first word line WL1 between them.

The second transistor Tr2 is formed below the second bit line BL2. The second transistor Tr2 has a second gate electrode, the second source/drain diffusion layer S/D2, and a third source/drain diffusion layer S/D3. The second gate electrode is made of the second word line WL2. The second and third source/drain diffusion layers S/D2 and S/D3 are formed below the second bit line BL2 so as to sandwich the second word line WL2 between them.

The second source/drain diffusion layer S/D2 is formed between the first and second word lines WL1 and WL2. The second source/drain diffusion layer S/D2 functions as one end of the current path of the first transistor Tr1, and also functions as one end of the current path of the second transistor Tr2. That is, the second source/drain diffusion layer S/D2 is formed by one diffusion layer shared by the first and second transistors Tr1 and Tr2.

A contact C1 is formed on the first source/drain diffusion layer S/D1. The contact C1 connects the first MTJ element MTJ1 and first source/drain diffusion layer S/D1.

A contact C2 is formed on the third source/drain diffusion layer S/D3. The contact C2 connects the second MTJ element MTJ2 and third source/drain diffusion layer S/D3.

A contact C3 is formed on the second source/drain diffusion layer S/D2. The contact C3 connects the second source/drain diffusion layer S/D2 and lower electrode layer 14-3.

Note that the layout and sectional structure of the memory cell are not limited to FIGS. 2, 3A, and 3B. For example, the connection between the second source/drain diffusion layer S/D2 and third MTJ element MTJ3 can also be changed as follows.

Figure 4:
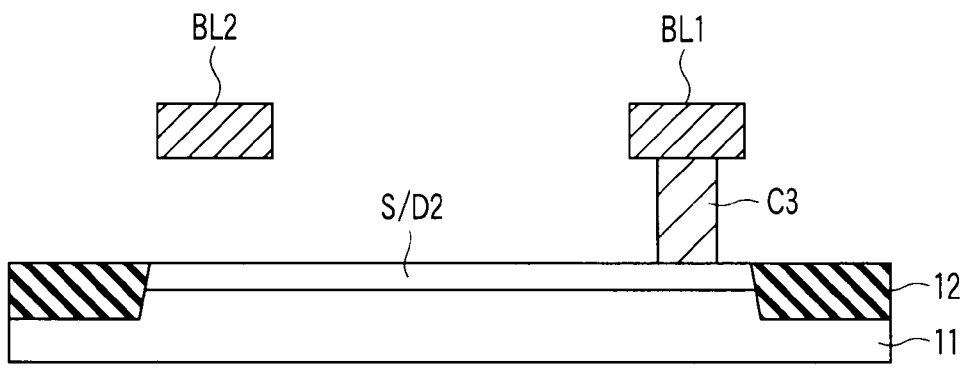
FIG. 4 is a sectional view of the memory cell of the magnetic random access memory according to the embodiment of the present invention.

As shown in FIG. 4, the second source/drain diffusion layer S/D2 may also extend from a portion below the second bit line BL2 to a portion below the first bit line BL1 in the direction (in this embodiment, the Y direction) in which the first and second word lines WL1 and WL2 run, and connect to the third MTJ element MTJ3 via the contact C3 and lower electrode layer 14-3 formed below the first bit line BL1. In this case, an element region including the first, second, and third source/drain diffusion layers S/D1, S/D2, and S/D3 has a projecting shape when viewed from above. This element region having a projecting shape has a first portion parallel to the bit lines BL and a second portion parallel to the word lines WL. In the memory cell MC1, for example, the first portion is positioned below the second bit line BL2, and the second portion is positioned between the first and second word lines WL1 and WL2.

Figure 5:
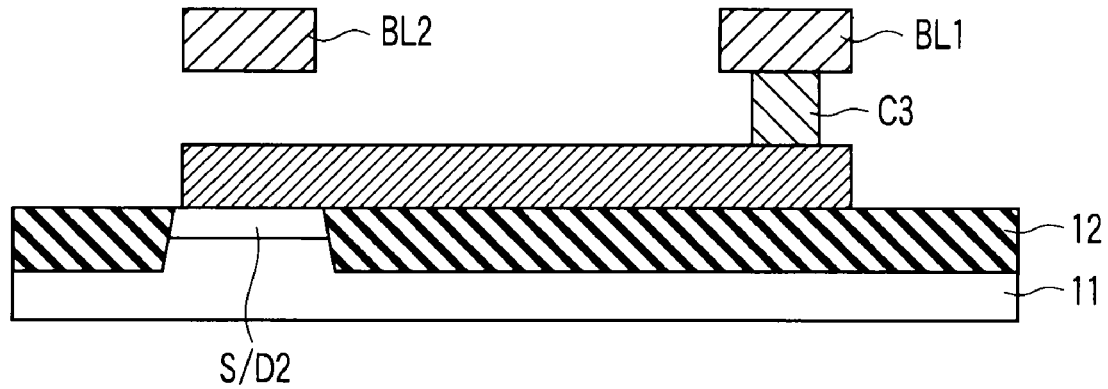
FIG. 5 is a sectional view of the memory cell of the magnetic random access memory according to the embodiment of the present invention.

As shown in FIG. 5, an interconnection layer 15 made of, e.g., polysilicon may also be formed between the first and second word lines WL1 and WL2. The interconnection layer 15 extends from a portion below the second bit line BL2 to a portion below the first bit line BL1 in the direction (in this embodiment, the Y direction) in which the first and second word lines WL1 and WL2 run. The interconnection layer 15 is laid on a semiconductor substrate 1, and in contact with the second source/drain diffusion layer S/D2 and an element isolation region 12. The contact C3 is formed below the first bit line BL1 between the first and second word lines WL1 and WL2. The contact C3 and lower electrode layer 14-3 connect the interconnection layer 15 and third MTJ element MTJ3.

[1-3] MTJ Element

The structure, shape, and the like of the MTJ element applied to the embodiment of the present invention are not limited and can be variously changed.

The MTJ element can have a single-junction structure having one insulating layer, or a double-junction structure having two insulating layers. An MTJ element having this double-junction structure comprises a first fixed layer, a second fixed layer, a recording layer formed between the first and second fixed layers, a first insulating layer formed between the first fixed layer and recording layer, and a second insulating layer formed between the second fixed layer and recording layer.

The planar shape of the MTJ element is not limited to a square shown in the drawing. For example, the planar shape of the MTJ element can be variously changed to a rectangle, ellipse, circle, hexagon, rhombus, parallelogram, cross, or bean (recessed shape).

The MTJ element can be a perpendicular magnetization type element in which the magnetization directions in the fixed layer and recording layer are perpendicular to the film surface of the insulating layer, or a parallel magnetization type (longitudinal magnetization type) element in which they are parallel to the film surface of the insulating layer.

[2] Write Method

[2-1] Write Method Using Spin Injection Magnetization Reversing Technique

The embodiment of the present invention uses spin injection write using the spin injection magnetization reversing technique. That is, the magnetization direction in the recording layer is reversed by supplying a write current equal to or larger than a magnetization reversing threshold current by applying a potential difference to the two terminals of the MTJ element, and the relative magnetization directions in the fixed layer and recording layer are made parallel or antiparallel in accordance with the direction of the write current.

Figures 6A, 6B:
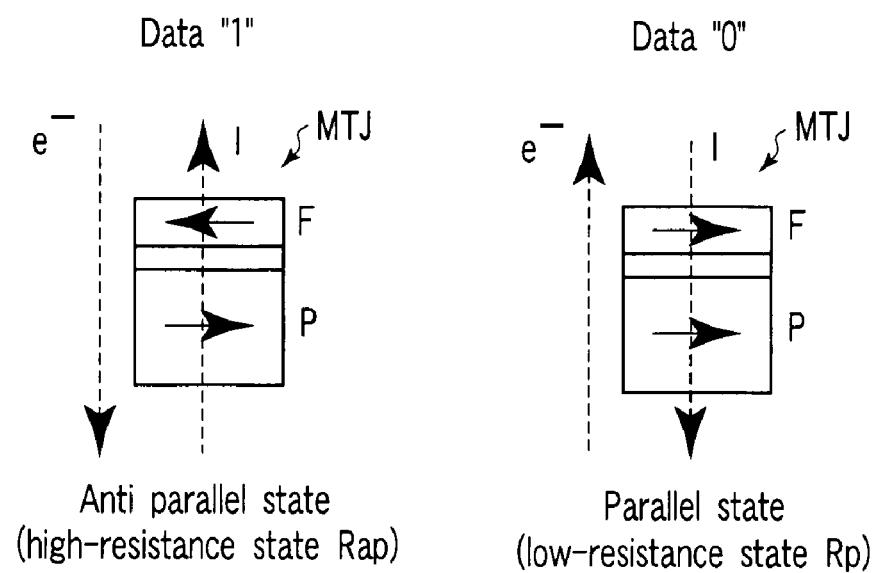
FIGS. 6A and 6B are views for explaining spin injection write of the magnetic random access memory according to the embodiment of the present invention.

FIGS. 6A and 6B are views for explaining spin injection write of the magnetic random access memory according to the embodiment of the present invention. Note that in FIGS. 6A and 6B, the magnetization directions in the fixed layer and recording layer of the MTJ element are parallel to the film surface for the sake of convenience. However, these magnetization directions may, of course, also be perpendicular to the film surface.

When writing data "1", as shown in FIG. 6A, an electric current I is supplied from the fixed layer P to the recording layer F of the MTJ element MTJ. That is, electrons e are injected from the recording layer F into the fixed layer P. In this state, electrons having spins in a direction opposite to the magnetization direction in the fixed layer P are reflected toward the fixed layer P by the recording layer F. Magnetization reversal occurs in the recording layer F by the movement of the spin angular momentum caused by the exchange interaction between the reflected electrons and electrons in the recording layer F. This makes the magnetization directions in the fixed layer P and recording layer F opposite and antiparallel. This state is defined as data "1".

On the other hand, when writing data "0", as shown in FIG. 6B, the electric current I is supplied from the recording layer F to the fixed layer P of the MTJ element MTJ. That is, the electrons e are injected from the fixed layer P into the recording layer F. In this state, the fixed layer P functions as a spin filter, so electrons having spins in the direction opposite to the magnetization direction in the fixed layer P cannot pass through it. As a result, only electrons having spins in the same direction as the magnetization direction in the fixed layer P are injected into the recording layer F. That is, the fixed layer P functions as a spin injection source in this case. In the same manner as in write of "1", magnetization reversal occurs in the recording layer F by the movement of the spin angular momentum caused by the exchange interaction between the electrons injected into the recording layer F and the electrons in the recording layer F. This makes the magnetization directions in the fixed layer P and recording layer F equal and parallel. This state is defined as data "0".

[2-2] Outline of Writ Operation

Figure 7:
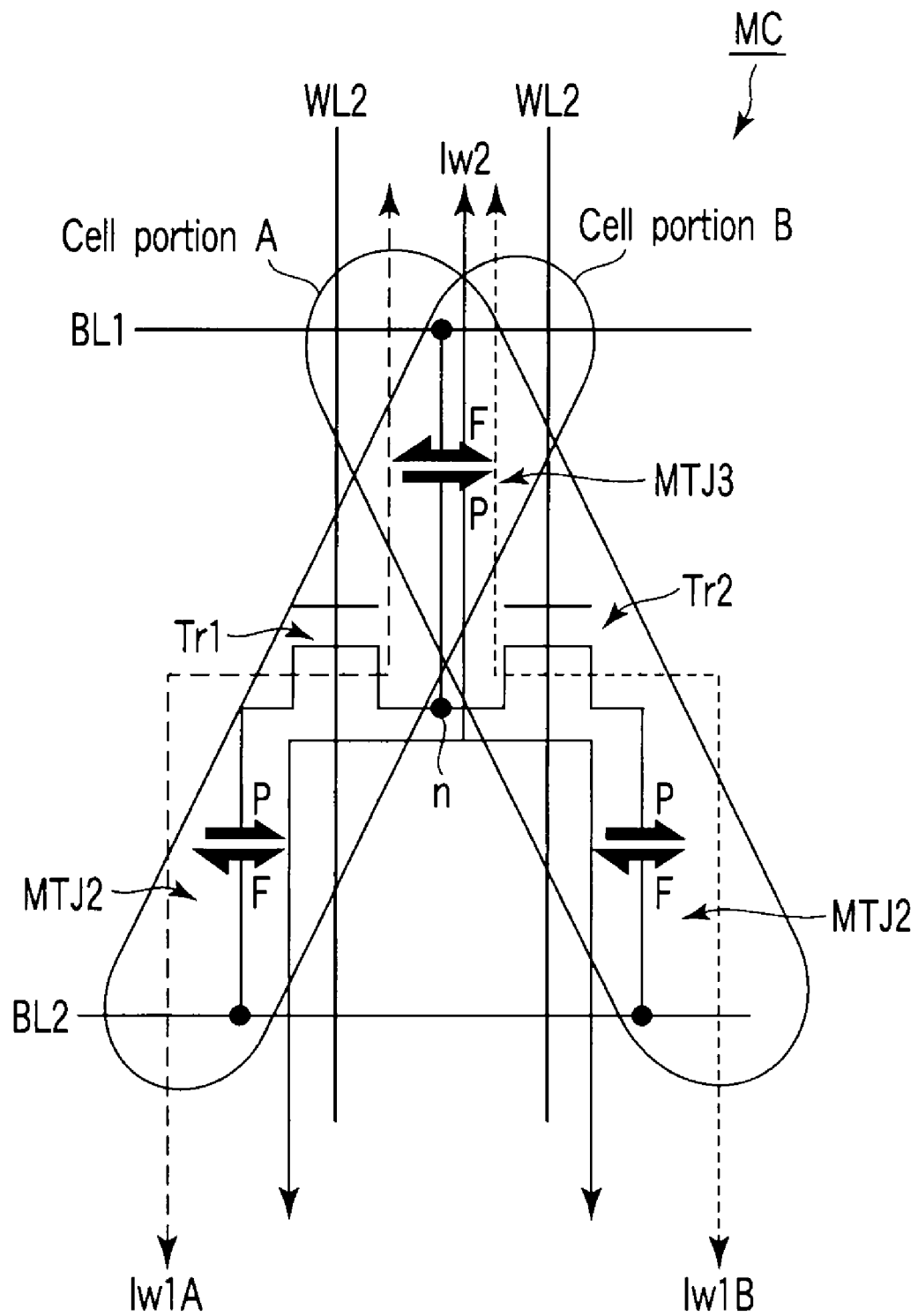
FIG. 7 is a view for explaining an outline of the write operation of the magnetic random access memory according to the embodiment of the present invention.

FIG. 7 is a view for explaining an outline of the write operation of the magnetic random access memory according to the embodiment of the present invention. An outline of the write operation of the memory cell according to the embodiment of the present invention will be explained below.

In the embodiment of the present invention as shown in FIG. 7, the memory cell MC comprises the three MTJ elements MTJ1, MTJ2, and MTJ3. A cell portion having the first and third MTJ elements MTJ1 and MTJ3 is defined as cell portion A, and a cell portion having the second and third MTJ elements MTJ2 and MTJ3 is defined as cell portion B.

Write to the memory cell MC as described above includes a first write operation in which a write current Iw1A flows through cell portion A, a second write operation in which a write current Iw1B flows through cell portion B, and a third write operation in which a write current Iw2 flows through the whole memory cell.

In the first write operation, the write current Iw1A is supplied to the first and third MTJ elements MTJ1 and MTJ3 in cell portion A by turning on the gate of the first transistor Tr1. As a consequence, data corresponding to the direction of the write current Iw1A are simultaneously written in the first and third MTJ elements MTJ1 and MTJ3 (opposite data are written in the MTJ elements MTJ1 and MTJ3).

In the second write operation, the write current Iw1B is supplied to the second and third MTJ elements MTJ2 and MTJ3 in cell portion B by turning on the gate of the second transistor Tr2. Consequently, data corresponding to the write current Iw1B are simultaneously written in the second and third MTJ elements MTJ2 and MTJ3 (opposite data are written in the MTJ elements MTJ2 and MTJ3).

In the third write operation, the write current Iw2 is supplied to the first, second, and third MTJ elements MTJ1, MTJ2, and MTJ3 of the whole memory cell by turning on the gates of both the first and second transistors Tr1 and Tr2. In this state, only a divided current about half the write current Iw2 flows through the first and second MTJ elements MTJ1 and MTJ2 (if the channel resistances of the transistors are neglected, the current amount of the divided current corresponds to the reciprocal of the resistance ratio of the first and second MTJ elements MTJ1 and MTJ2). Hence, no magnetization reversal occurs in the recording layers F of the first and second MTJ elements MTJ1 and MTJ2. Accordingly, data corresponding to the direction of the write current Iw2 is written in only the third MTJ element MTJ3.

The order of the first to third write operations described above is such that one of the first and second write operations is performed first, then the other of the first and second write operations is performed, and finally the third write operation is performed.

The reason is as follows. In the first write operation, the write current Iw1A for writing data in the first MTJ element MTJ1 also flows through the third MTJ element MTJ3, so data are written in both the first and third MTJ elements MTJ1 and MTJ3. Likewise, in the second write operation, the write current Iw1B for writing data in the second MTJ element MTJ2 also flows through the third MTJ element MTJ3, so data are written in both the second and third MTJ elements MTJ2 and MTJ3. Accordingly, if the first and second write operations are performed after data is written in the third MTJ element MTJ3 by the third write operation, the data in the third MTJ element MTJ3 may be rewritten depending on the combination of the data written by the first and second write operations. Also, when the same data is written in the first and second MTJ elements MTJ1 and MTJ2 by the first and second write operations and this data is to be written in the third MTJ element MTJ3 as well, the third write operation must be performed by supplying a write current in a direction opposite to that of the write current in each of the first and second write operations. Therefore, the third write operation is executed after the first and second write operations are executed.

Note that either the first or second write operation can be performed first, and the third write operation can also be omitted when using practical example 2, 3, or the like of the write method to be described later.

[2-3] Practical Example 1 of Write Method

Practical example 1 of the write method is a method of implementing 8-level write including the case where the write operation is performed three times for one memory cell MC.

FIGS. 8A to 8H are views for explaining practical example 1 of the write method of the memory cell according to the embodiment of the present invention. Referring to FIGS. 8A to 8H, a coarse dotted arrow indicates a first write operation, a fine dotted arrow indicates a second write operation, and a solid arrow indicates a third write operation. Practical example 1 of the write method of the memory cell according to the embodiment of the present invention will be explained below. Note that this explanation will be made by using a circuit in which the fixed layer P of the third MTJ element MTJ3 is connected to a node n.

FIG. 8A shows an example when writing data "0" in the first MTJ element MTJ1, data "0" in the second MTJ element MTJ2, and data "1" in the third MTJ element MTJ3. This write is performed by the following sequence. In the first write operation, a write current Iw1 is supplied from the recording layer F to the fixed layer P of the first MTJ element MTJ1 by turning on the gate of the first transistor Tr1. This makes the magnetization directions in the fixed layer P and recording layer F of the first MTJ element MTJ1 parallel, so data "0" is written in the first MTJ element MTJ1. In the second write operation, the write current Iw2 is supplied from the recording layer F to the fixed layer P of the second MTJ element MTJ2 by turning on the gate of the second transistor Tr2. This makes the magnetization directions in the fixed layer P and recording layer F of the second MTJ element MTJ2 parallel, so data "0" is written in the second MTJ element MTJ2. In this case, the write current Iw2 flows from the fixed layer P to the recording layer F of the third MTJ element MTJ3. When the second write operation is complete, therefore, the magnetization directions in the fixed layer P and recording layer F of the third MTJ element MTJ3 are antiparallel, so data "1" is written in the third MTJ element MTJ3. Accordingly, this example requires no third write operation of writing data in the third MTJ element MTJ3.

FIG. 8B shows an example when writing data "0" in the first MTJ element MTJ1, data "1" in the second MTJ element MTJ2, and data "0" in the third MTJ element MTJ3. This write is performed by the following sequence. In the first write operation, the write current Iw1 is supplied from the recording layer F to the fixed layer P of the first MTJ element MTJ1 by turning on the gate of the first transistor Tr1. This makes the magnetization directions in the fixed layer P and recording layer F of the first MTJ element MTJ1 parallel, so data "0" is written in the first MTJ element MTJ1. In the second write operation, the write current Iw2 is supplied from the fixed layer P to the recording layer F of the second MTJ element MTJ2 by turning on the gate of the second transistor Tr2. This makes the magnetization directions in the fixed layer P and recording layer F of the second MTJ element MTJ2 antiparallel, so data "1" is written in the second MTJ element MTJ2. In this case, the write current Iw2 flows from the recording layer F to the fixed layer P of the third MTJ element MTJ3. When the second write operation is complete, therefore, the magnetization directions in the fixed layer P and recording layer F of the third MTJ element MTJ3 are parallel, so data "0" is written in the third MTJ element MTJ3. Accordingly, this example requires no third write operation of writing data in the third MTJ element MTJ3.

FIG. 8C shows an example when writing data "1" in the first MTJ element MTJ1, data "0" in the second MTJ element MTJ2, and data "1" in the third MTJ element MTJ3. This write is performed by the following sequence. In the first write operation, the write current Iw1 is supplied from the fixed layer P to the recording layer F of the first MTJ element MTJ1 by turning on the gate of the first transistor Tr1. This makes the magnetization directions in the fixed layer P and recording layer F of the first MTJ element MTJ1 antiparallel, so data "1" is written in the first MTJ element MTJ1. In the second write operation, the write current Iw2 is supplied from the recording layer F to the fixed layer P of the second MTJ element MTJ2 by turning on the gate of the second transistor Tr2. This makes the magnetization directions in the fixed layer P and recording layer F of the second MTJ element MTJ2 parallel, so data "0" is written in the second MTJ element MTJ2. In this case, the write current Iw2 flows from the fixed layer P to the recording layer F of the third MTJ element MTJ3. When the second write operation is complete, therefore, the magnetization directions in the fixed layer P and recording layer F of the third MTJ element MTJ3 are antiparallel, so data "1" is written in the third MTJ element MTJ3. Accordingly, this example requires no third write operation of writing data in the third MTJ element MTJ3.

FIG. 8D shows an example when writing data "1" in the first MTJ element MTJ1, data "1" in the second MTJ element MTJ2, and data "1" in the third MTJ element MTJ3. This write is performed by the following sequence. In the first write operation, the write current Iw1 is supplied from the fixed layer P to the recording layer F of the first MTJ element MTJ1 by turning on the gate of the first transistor Tr1. This makes the magnetization directions in the fixed layer P and recording layer F of the first MTJ element MTJ1 antiparallel, so data "1" is written in the first MTJ element MTJ1. In the second write operation, the write current Iw2 is supplied from the fixed layer P to the recording layer F of the second MTJ element MTJ2 by turning on the gate of the second transistor Tr2. This makes the magnetization directions in the fixed layer P and recording layer F of the second MTJ element MTJ2 antiparallel, so data "1" is written in the second MTJ element MTJ2. In this case, the write current Iw2 flows from the recording layer F to the fixed layer P of the third MTJ element MTJ3. When the second write operation is complete, therefore, the magnetization directions in the fixed layer P and recording layer F of the third MTJ element MTJ3 are parallel, so data "0" is written in the third MTJ element MTJ3. Accordingly, this example requires a third write operation of writing data "1" in the third MTJ element MTJ3. In the third write operation, a write current Iw3 is supplied from the fixed layer P to the recording layer F of the third MTJ element MTJ3 by turning on the gates of both the first and second transistors Tr1 and Tr2. Since this makes the magnetization directions in the fixed layer P and recording layer F of the third MTJ element MTJ3 antiparallel, data "1" is written in the third MTJ element MTJ3.

FIG. 8E shows an example when writing data "0" in the first MTJ element MTJ1, data "0" in the second MTJ element MTJ2, and data "0" in the third MTJ element MTJ3. This write is performed by the following sequence. In the first write operation, the write current Iw1 is supplied from the recording layer F to the fixed layer P of the first MTJ element MTJ1 by turning on the gate of the first transistor Tr1. This makes the magnetization directions in the fixed layer P and recording layer F of the first MTJ element MTJ1 parallel, so data "0" is written in the first MTJ element MTJ1. In the second write operation, the write current Iw2 is supplied from the recording layer F to the fixed layer P of the second MTJ element MTJ2 by turning on the gate of the second transistor Tr2. This makes the magnetization directions in the fixed layer P and recording layer F of the second MTJ element MTJ2 parallel, so data "0" is written in the second MTJ element MTJ2. In this case, the write current Iw2 flows from the fixed layer P to the recording layer F of the third MTJ element MTJ3. When the second write operation is complete, therefore, the magnetization directions in the fixed layer P and recording layer F of the third MTJ element MTJ3 are antiparallel, so data "1" is written in the third MTJ element MTJ3. Accordingly, this example requires a third write operation of writing data "0" in the third MTJ element MTJ3. In the third write operation, the write current Iw3 is supplied from the recording layer F to the fixed layer P of the third MTJ element MTJ3 by turning on the gates of both the first and second transistors Tr1 and Tr2. Since this makes the magnetization directions in the fixed layer P and recording layer F of the third MTJ element MTJ3 parallel, data "0" is written in the third MTJ element MTJ3.

FIG. 8F shows an example when writing data "0" in the first MTJ element MTJ1, data "1" in the second MTJ element MTJ2, and data "1" in the third MTJ element MTJ3. This write is performed by the following sequence. In the first write operation, the write current Iw1 is supplied from the fixed layer P to the recording layer F of the second MTJ element MTJ2 by turning on the gate of the second transistor Tr2. This makes the magnetization directions in the fixed layer P and recording layer F of the second MTJ element MTJ2 antiparallel, so data "1" is written in the second MTJ element MTJ2. In the second write operation, the write current Iw2 is supplied from the recording layer F to the fixed layer P of the first MTJ element MTJ1 by turning on the gate of the first transistor Tr1. This makes the magnetization directions in the fixed layer P and recording layer F of the first MTJ element MTJ1 parallel, so data "0" is written in the first MTJ element MTJ1. In this case, the write current Iw2 flows from the fixed layer P to the recording layer F of the third MTJ element MTJ3. When the second write operation is complete, therefore, the magnetization directions in the fixed layer P and recording layer F of the third MTJ element MTJ3 are antiparallel, so data "1" is written in the third MTJ element MTJ3. Accordingly, this example requires no third write operation of writing data in the third MTJ element MTJ3.

FIG. 8G shows an example when writing data "1" in the first MTJ element MTJ1, data "0" in the second MTJ element MTJ2, and data "0" in the third MTJ element MTJ3. This write is performed by the following sequence. In the first write operation, the write current Iw1 is supplied from the recording layer F to the fixed layer P of the second MTJ element MTJ2 by turning on the gate of the second transistor Tr2. This makes the magnetization directions in the fixed layer P and recording layer F of the second MTJ element MTJ2 parallel, so data "0" is written in the second MTJ element MTJ2. In the second write operation, the write current Iw2 is supplied from the fixed layer P to the recording layer F of the first MTJ element MTJ1 by turning on the gate of the first transistor Tr1. This makes the magnetization directions in the fixed layer P and recording layer F of the first MTJ element MTJ1 antiparallel, so data "1" is written in the first MTJ element MTJ1. In this case, the write current Iw2 flows from the recording layer F to the fixed layer P of the third MTJ element MTJ3. When the second write operation is complete, therefore, the magnetization directions in the fixed layer P and recording layer F of the third MTJ element MTJ3 are parallel, so data "0" is written in the third MTJ element MTJ3. Accordingly, this example requires no third write operation of writing data in the third MTJ element MTJ3.

FIG. 8H shows an example when writing data "1" in the first MTJ element MTJ1, data "1" in the second MTJ element MTJ2, and data "0" in the third MTJ element MTJ3. This write is performed by the following sequence. In the first write operation, the write current Iw1 is supplied from the fixed layer P to the recording layer F of the first MTJ element MTJ1 by turning on the gate of the first transistor Tr1. This makes the magnetization directions in the fixed layer P and recording layer F of the first MTJ element MTJ1 antiparallel, so data "1" is written in the first MTJ element MTJ1. In the second write operation, the write current Iw2 is supplied from the fixed layer P to the recording layer F of the second MTJ element MTJ2 by turning on the gate of the second transistor Tr2. This makes the magnetization directions in the fixed layer P and recording layer F of the second MTJ element MTJ2 antiparallel, so data "1" is written in the second MTJ element MTJ2. In this case, the write current Iw2 flows from the recording layer F to the fixed layer P of the third MTJ element MTJ3. When the second write operation is complete, therefore, the magnetization directions in the fixed layer P and recording layer F of the third MTJ element MTJ3 are parallel, so data "0" is written in the third MTJ element MTJ3. Accordingly, this example requires no third write operation of writing data in the third MTJ element MTJ3.

Note that in FIG. 8D, the write current Iw3 also flows from the recording layer F to the fixed layer P of each of the first and second MTJ elements MTJ1 and MTJ2. Similarly, in FIG. 8E, the write current Iw3 flows from the fixed layer P to the recording layer F of each of the first and second MTJ elements MTJ1 and MTJ2. However, only an electric current about half the current density at which spin injection magnetization reversal can occur flows through each of the MTJ elements MTJ1 and MTJ2. Hence, no magnetization reversal occurs in the recording layer F of each of the MTJ elements MTJ1 and MTJ2.

[2-4] Practical Example 2 of Write Method

When the write operation is performed for each of the first and second MTJ elements MTJ1 and MTJ2 in practical example 1 of the write method, data opposite to that written in the first or second MTJ element MTJ1 or MTJ2 by the second write operation is written in the third MTJ element MTJ3.

Practical example 2 of the write method uses this phenomenon. That is, when data to be written in the third MTJ element MTJ3 is opposite to that of at least one of the first and second MTJ elements MTJ1 and MTJ2, the write operation of writing the data opposite to that of the third MTJ element MTJ3 is also used as the write operation of the third MTJ element MTJ3. Accordingly, the order of the write operations of the first and second MTJ elements MTJ1 and MTJ2 need only be determined in accordance with the polarity of the data to be written in the third MTJ element MTJ3. In practical example 2 of the write method, therefore, the number of write operations is two in each case.

Note that practical example 2 of the write method does not include cases (the cases shown in FIGS. 8D and 8E) where the same data is written in all the first, second, and third MTJ elements MTJ1, MTJ2, and MTJ3. Therefore, practical example 2 of the write method is a method of implementing 6-level write.

FIGS. 9A to 9F are views for explaining practical example 2 of the write method of the memory cell according to the embodiment of the present invention. Referring to FIGS. 9A to 9F, a coarse dotted arrow indicates a first write operation, and a fine dotted arrow indicates a second write operation. Practical example 2 of the write method of the memory cell according to the embodiment of the present invention will be explained below.

Figure 9A:
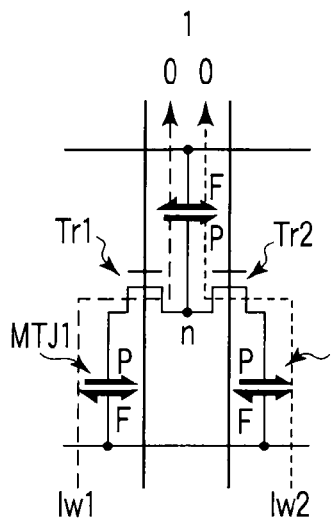
FIGS. 9A to 9F are views for explaining practical example 2 of the write method of the memory cell according to the embodiment of the present invention.

FIG. 9A shows an example in which when writing data "1" in the third MTJ element MTJ3, the write operation of writing data "0" opposite to data "1" in the second MTJ element MTJ2 is performed as the second write operation. In this example, the second write operation is used as write to both the second and third MTJ elements MTJ2 and MTJ3. Details of the write operation of this example are the same as those shown in FIG. 8A, so a repetitive explanation will be omitted. Note that the operation of writing data "0" is also performed for the first MTJ element MTJ1, so data "1" can be written in the third MTJ element MTJ3 even when the write operation of the first MTJ element MTJ1 is performed as the second write operation.

Figure 9B:
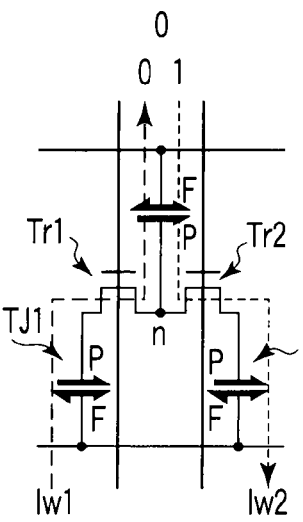

FIG. 9B shows an example in which when writing data "0" in the third MTJ element MTJ3, the write operation of writing data "1" opposite to data "0" in the second MTJ element MTJ2 is performed as the second write operation. In this example, the second write operation is used as write to both the second and third MTJ elements MTJ2 and MTJ3. Details of the write operation of this example are the same as those shown in FIG. 8B, so a repetitive explanation will be omitted.

Figure 9C:
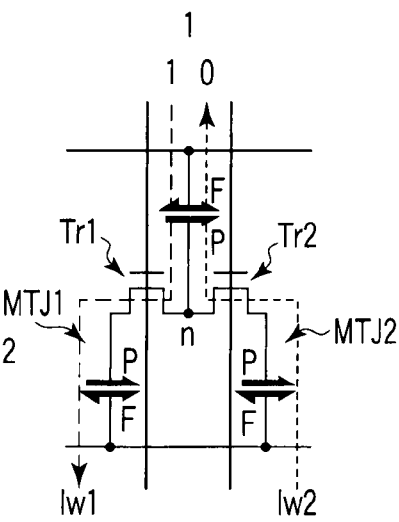

FIG. 9C shows an example in which when writing data "1" in the third MTJ element MTJ3, the write operation of writing data "0" opposite to data "1" in the second MTJ element MTJ2 is performed as the second write operation. In this example, the second write operation is used as write to both the second and third MTJ elements MTJ2 and MTJ3. Details of the write operation of this example are the same as those shown in FIG. 8C, so a repetitive explanation will be omitted.

Figure 9D:
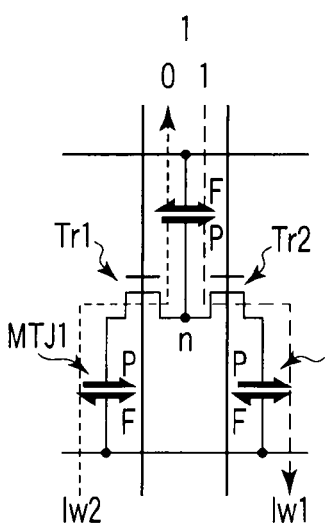

FIG. 9D shows an example in which when writing data "1" in the third MTJ element MTJ3, the write operation of writing data "0" opposite to data "1" in the first MTJ element MTJ1 is performed as the second write operation. In this example, the second write operation is used as write to both the first and third MTJ elements MTJ1 and MTJ3. Details of the write operation of this example are the same as those shown in FIG. 8F, so a repetitive explanation will be omitted.

Figure 9E:
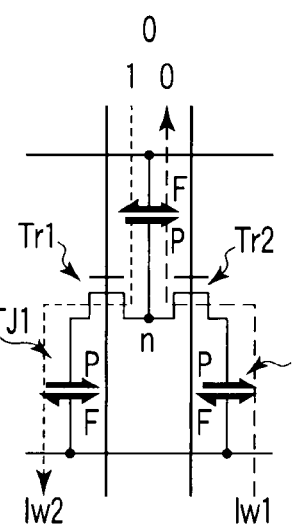

FIG. 9E shows an example in which when writing data "0" in the third MTJ element MTJ3, the write operation of writing data "1" opposite to data "0" in the first MTJ element MTJ1 is performed as the second write operation. In this example, the second write operation is used as write to both the first and third MTJ elements MTJ1 and MTJ3. Details of the write operation of this example are the same as those shown in FIG. 8G, so a repetitive explanation will be omitted.

Figure 9F:
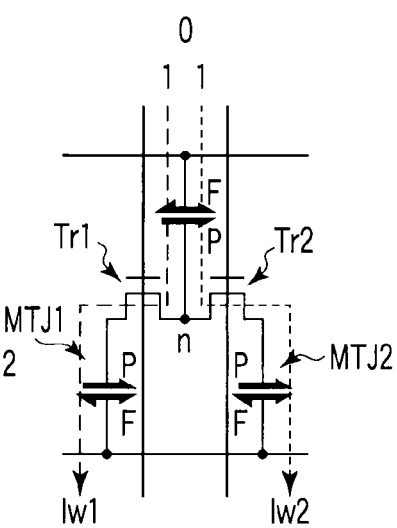
Figures 10A, 10B:
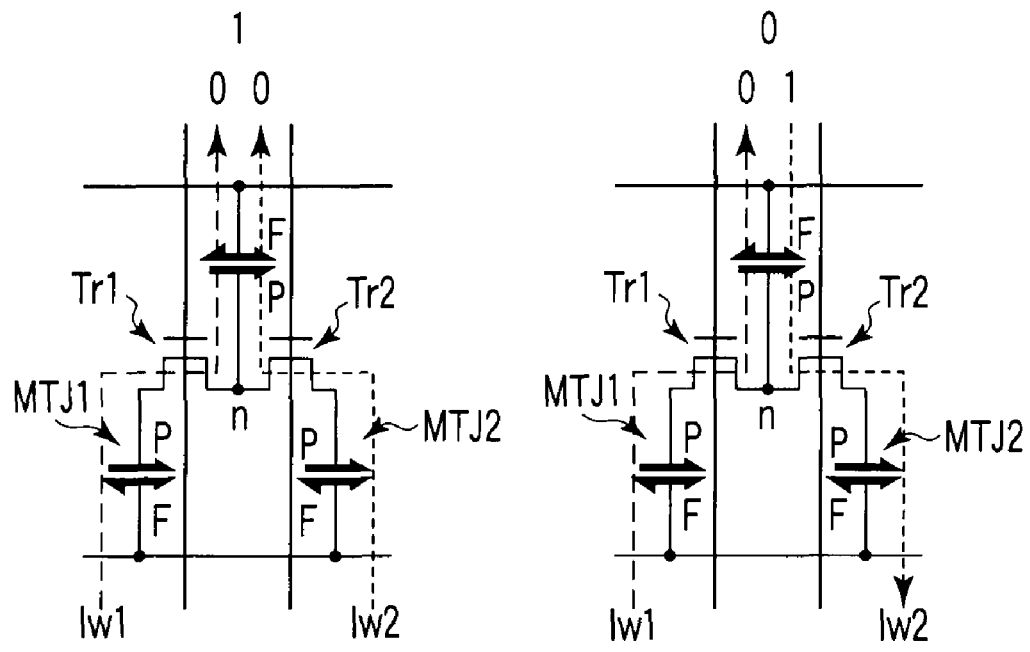
FIGS. 10A to 10D are views for explaining practical example 3 of the write method of the memory cell according to the embodiment of the present invention.
Figures 10C, 10D:
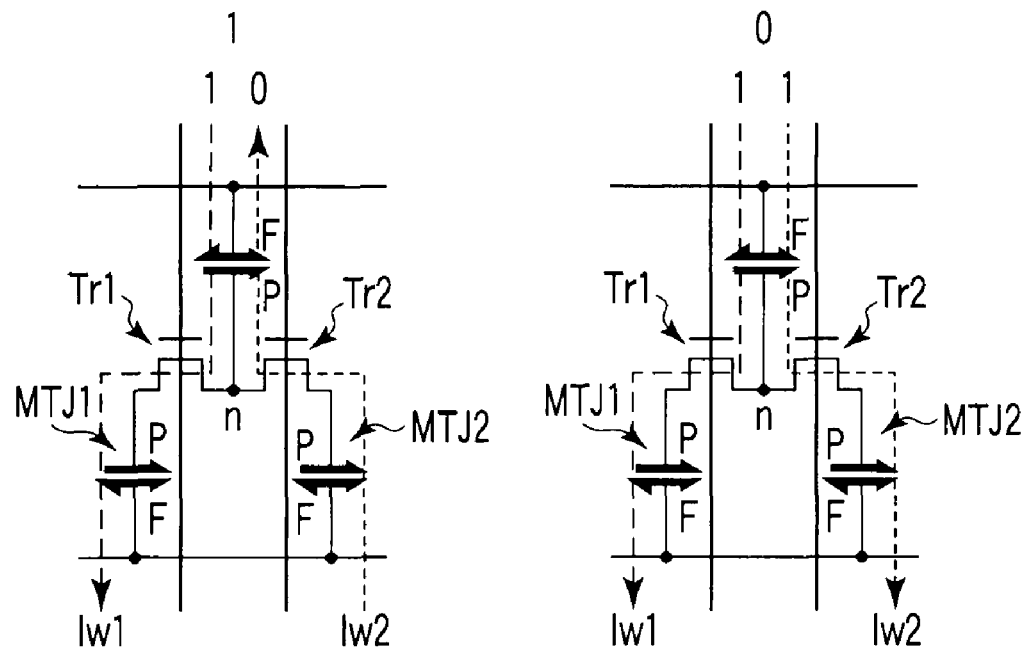

FIG. 9F shows an example in which when writing data "0" in the third MTJ element MTJ3, the write operation of writing data "1" opposite to data "0" in the second MTJ element MTJ2 is performed as the second write operation. In this example, the second write operation is used as write to both the second and third MTJ elements MTJ2 and MTJ3. Details of the write operation of this example are the same as those shown in FIG. 8H, so a repetitive explanation will be omitted. Note that the operation of writing data "1" is also performed for the first MTJ element MTJ1, so data "0" can be written in the third MTJ element MTJ3 even when the write operation of the first MTJ element MTJ1 is performed as the second write operation.

Practical examples 1 and 2 of the write method have been explained by taking the circuit configuration in which the fixed layer P of the third MTJ element MTJ3 is connected to the common node n as an example. That is, data opposite to that written by the second write operation of the first or second MTJ element MTJ1 or MTJ2 is written in the third MTJ element MTJ3. However, the recording layer F of the third MTJ element MTJ3 may also be connected to the common node n. In this case, the same data as that written by the second write operation of the first and second MTJ elements MTJ1 and MTJ2 is written in the third MTJ element MTJ3.

[2-5] Practical Example 3 of Write Method

In practical example 3 of the write method, the third MTJ element MTJ3 functions as a replica element for holding opposite polarity data of one of the first and second MTJ elements MTJ1 and MTJ2 for which the last write operation is performed. Practical example 3 of the write method can store a data amount of two bits (quaternary) as in the conventional method. However, practical example 3 of the write method has the advantage that 2-bit data can be read out by one read operation as will be described below.

FIGS. 10A to 10D are views for explaining practical example 3 of the write method of the memory cell according to the embodiment of the present invention. Referring to FIGS. 10A to 10D, a coarse dotted arrow indicates a first write operation, and a fine dotted arrow indicates a second write operation. Practical example 3 of the write method of the memory cell according to the embodiment of the present invention will be explained below. Note that operations shown in FIGS. 10A to 10D are the same as those shown in FIGS. 8A to 8C and 8H, so a repetitive explanation will be omitted.

In practical example 3 as shown in FIGS. 10A to 10D, the fixed layer P of the third MTJ element MTJ3 is connected to the node n as in, e.g., practical example 1 so that the third MTJ element MTJ3 functions as an opposite data element of the second MTJ element MTJ2 having undergone the second write operation.

In the write method of practical example 3, the order of the write operations of the first and second MTJ elements MTJ1 and MTJ2 is determined such that the first write operation is performed for the first MTJ element MTJ1, and the second write operation is performed for the second MTJ element MTJ2.

When the second write operation is performed in this order, the magnetization directions in the fixed layer P and recording layer F of the third MTJ element MTJ3 take the parallel state or antiparallel state owing to the action of the write current Iw2. In this example, the magnetization state of the third MTJ element MTJ3 is always opposite to that of the second MTJ element MTJ2. That is, magnetization in the third MTJ element MTJ3 is in the antiparallel state (data "1") when magnetization in the second MTJ element MTJ2 is in the parallel state (data "0"), and in the parallel state (data "0") when magnetization in the second MTJ element MTJ2 is in the antiparallel state (data "1"). Thus, the third MTJ element MTJ3 functions as a replica element for holding opposite polarity data of the second MTJ element MTJ2 for which the second write operation is performed.

Note that it is of course also possible to determine the order so as to perform the first write operation for the second MTJ element MTJ2, and the second write operation for the first MTJ element MTJ1.

Note also that the direction of the electric current flowing through the fixed layer P and recording layer F of the third MTJ element MTJ3 can be made equal to that of the electric current flowing through the fixed layer P and recording layer F of each of the first and second MTJ elements MTJ1 and MTJ2. That is, it is also possible to respectively connect the recording layer F and fixed layer P of the third MTJ element MTJ3 to the node n and bit line.

[3] Read Method

[3-1] Read Method Using Tunneling Magnetoresistive Effect

The embodiment of the present invention performs data read using the tunneling magnetoresistive effect.

The MTJ element MTJ has the tunneling magnetoresistive effect by which the magnitude of the tunnel current changes in accordance with whether the magnetization directions in the fixed layer P and recording layer F are parallel or antiparallel.

When the magnetization directions in the fixed layer P and recording layer F of the MTJ element MTJ are antiparallel (data "1"), the MTJ element MTJ has a high resistance (FIG. 6A). When the magnetization directions in the fixed layer P and recording layer F of the MTJ element MTJ are parallel (data "0"), the MTJ element MTJ has a low resistance (FIG. 6B). That is, the MTJ element MTJ takes two states, i.e., a low-resistance state Rp and high-resistance state Rap in accordance with the relative magnetization directions in the recording layer F and fixed layer P. Therefore, whether data is "1" or "0" is discriminated by supplying a read current to the MTJ element MTJ, and reading out the resistance value of the MTJ element MTJ.

[3-2] Outline of Read Operation

FIG. 11 is a view for explaining an outline of the read operation of the magnetic random access memory according to the embodiment of the present invention. An outline of the read operation of the magnetic random access memory according to the embodiment of the present invention will be explained below.

In the embodiment of the present invention as shown in FIG. 11, the memory cell MC comprises the three MTJ elements MTJ1, MTJ2, and MTJ3 and hence has an information amount of $2^3$. In this embodiment, a cell portion having the first and third MTJ elements MTJ1 and MTJ3 is defined as cell portion A, and a cell portion having the second and third MTJ elements MTJ2 and MTJ3 is defined as cell portion B.

Data is read out from the memory cell MC as described above as follows. Data in the MTJ elements MTJ1 and MTJ3 can be simultaneously read out by supplying a read current IrA to cell portion A. Data in the MTJ elements MTJ2 and MTJ3 can be simultaneously read out by supplying a read current IrB to cell portion B. That is, $2^3$ data of the memory cell MC can be read out by performing the read operation only twice.

More specifically, one (in this example, BL<c>) of bit lines BL<t> and BL<c> is set at a fixed potential such as the ground potential, and two read word lines RWL<odd> and RWL<even> are each activated once after that.

When the read word line RWL is activated once, two MTJ elements (MTJ1 and MTJ3 or MTJ2 and MTJ3) are selected, and $2^2$ data, i.e., quaternary data are read out. For example, when the read word line RWL<odd> is activated, data of the first and third MTJ elements MTJ1 and MTJ3 are read out at once. When the read word line RWL<even> is activated, data of the second and third MTJ elements MTJ2 and MTJ3 are read out at once.

Note that in this read method, data (i.e., the resistance value of the memory cell MC) can be read out by an electric current by applying a constant voltage to the memory cell MC, or by a voltage by supplying a constant electric current to the memory cell MC.

[3-3] Principle of Data Discrimination

In the read method of the memory cell according to the embodiment of the present invention, data of two MTJ elements in cell portion A or B are read out by one read operation. Each data is discriminated by using the phenomenon in which the readout signal amount, i.e., the synthetic resistance value in cell portion A or B changes in accordance with written data.

In this example, the synthetic resistance value in cell portion A or B means not the synthetic resistance of the series connection of the two MTJ elements, but the synthetic resistance of the series connection of the two MTJ elements and memory cell transistor. The resistance of this memory cell transistor means the ON resistance of the transistor when the source potential rises in accordance with the product of the resistance value of the MTJ element on the source side and the read current. That is, the read operation of this example uses the phenomenon in which a gate-source potential difference Vgs of the transistor and a source-substrate (well) potential difference Vbs are different in accordance with the resistance value of the MTJ element on the source side, and the resulting substrate biasing effect and the reduction in gate-source potential difference Vgs change the ON resistance (channel resistance) of the transistor.

FIG. 12 is a view for explaining the data discrimination method in the read operation of the memory cell according to the embodiment of the present invention. The principle of data discrimination in the read operation of the memory cell according to the embodiment of the present invention will be explained below. Note that the principle of data discrimination will be explained by taking cell portion A shown in FIG. 11 as an example, but data can be discriminated by the same principle in cell portion B shown in FIG. 11 as well.

As shown in FIG. 12, the first and third MTJ elements MTJ1 and MTJ3 take the two states, i.e., the low-resistance state Rp and high-resistance state Rap in accordance with the relative magnetization directions in the recording layer F and fixed layer P. In this example, a state in which both the first and third MTJ elements MTJ1 and MTJ3 are in the high-resistance state Rap is defined as state "3", a state in which the first MTJ element MTJ1 is in the high-resistance state Rap and the third MTJ element MTJ3 is in the low-resistance state Rp is defined as state "2", a state in which the first MTJ element MTJ1 is in the low-resistance state Rp and the third MTJ element MTJ3 is in the high-resistance state Rap is defined as state "1", and a state in which both the first and third MTJ elements MTJ1 and MTJ3 are in the low-resistance state Rp is defined as state "0".

When only the resistance values of the first and third MTJ elements MTJ1 and MTJ3 are taken into consideration, the difference between the synthetic resistances of the first and third MTJ elements MTJ1 and MTJ3 in states "3" and "2" is (Rap–Rp), and the difference between the synthetic resistances of the first and third MTJ elements MTJ1 and MTJ3 in states "1" and "0" is (Rap–Rp). The synthetic resistances of the first and third MTJ elements MTJ1 and MTJ3 in states "3" and "0" are of course also different. Accordingly, it is possible to distinguish between states "3" and "2", states "1" and "0", and states "3" and "0" by referring to only the resistance values of the first and third MTJ elements MTJ1 and MTJ3.

When referring to only the resistance values of the first and third MTJ elements MTJ1 and MTJ3, however, both the synthetic resistances of the first and third MTJ elements MTJ1 and MTJ3 in states "2" and "1" are (Rap+Rp). Therefore, it is impossible to distinguish between states "2" and "1" by using only the resistance values of the first and third MTJ elements MTJ1 and MTJ3.

Accordingly, the read method according to the embodiment of the present invention uses the memory cell transistor. That is, this read method uses the phenomenon in which the potential of a node (to be referred to as a source node hereinafter) ns, on the side of the first MTJ element MTJ1, of the transistor Tr1 connected to the first MTJ element MTJ1 changes in accordance with the resistance value of the first MTJ element MTJ1.

For example, the potential of the source node ns rises when the first MTJ element MTJ1 is in the high-resistance state Rap. When the first MTJ element MTJ1 is in the low-resistance state Rp, the potential of the source node ns is lower than that when the first MTJ element MTJ1 is in the high-resistance state. That is, when the first MTJ element MTJ1 is in the high-resistance state Rap, the absolution value of the source-substrate (well) potential difference Vbs increases, so the threshold voltage rises to Vth[+]. In addition, the channel resistance increases because the gate-source potential difference Vgs decreases. On the other hand, when the first MTJ element MTJ1 is in the low-resistance state Rp, the absolute value of the source-substrate (well) potential difference Vbs is smaller than that when the first MTJ element MTJ1 is in the high-resistance state. Consequently, the threshold voltage decreases to Vth[–] lower than that when the first MTJ element MTJ1 is in the high-resistance state. In addition, since the gate-source potential difference Vgs is larger than that when the first MTJ element MTJ1 is in the high-resistance state, the channel resistance is lower than that when the first MTJ element MTJ1 is in the high-resistance state.

Accordingly, the threshold voltage Vth[+] of the transistor Tr1 rises when the first MTJ element MTJ1 is in state "2" as the high-resistance state Rap, and the threshold voltage Vth[–] of the transistor Tr1 lowers when the first MTJ element MTJ is in state "1" as the low-resistance state Rp.

When the transistor Tr1 is taken into consideration, the resistance value of the whole memory cell MC is (Rp+Vth[+]+Rap) in state "2" and (Rap+Vth[–]+Rp) in state "1" owing to the above effects. Therefore, the difference between the synthetic resistances of the first and third MTJ elements MTJ1 and MTJ3 and transistor Tr1 in states "2" and "1" is (Vth[+]–Vth[–]). This makes it possible to distinguish between states "2" and "1", and read out quaternary data in states "0" to "3".

Note that this example uses the phenomenon in which the channel resistance of the transistor changes in accordance with the resistance value of the first MTJ element MTJ1, since the bit line BL<c> connected to the first MTJ element MTJ1 is fixed to the ground potential. However, the present invention is not limited to this example. That is, when the bit line BL<t> connected to the third MTJ element MTJ3 is fixed to the ground potential, this example uses the phenomenon in which the potential of a node (to be referred to as a drain node hereinafter) nd, on the side of the third MTJ element MTJ3, of the transistor Tr1 changes in accordance with the resistance value of the third MTJ element MTJ3.

FIG. 13 is a waveform chart of read signals in states "0" to "3" in the read operation according to the embodiment of the present invention. The differences between readout signal amounts in states "0" to "3" will be explained below. Note that the readout signal can be either an electric current or potential.

As shown in FIG. 13, the readout signal amount changes in accordance with states "0" to "3" in the first and third MTJ elements MTJ1 and MTJ3, and gradually increases in the order of "0", "1", "2", and "3".

In an actual read operation, the difference between the readout signal amounts in states "2" and "1" is desirably equal to or larger than that between the readout signal amounts in states "3" and "2" or states "1" and "0", when a sense amplifier operation as will be described later is taken into account.

Note that as described above, the difference (Rap–Rp=(1+MR)Rp–Rp=RpMR) between the high-resistance state Rap and low-resistance state Rp of the MTJ element determines the difference (to be referred to as dV32 or dV10) between the readout signal amounts in states "3" and "2" or states "1" and "0". On the other hand, the threshold voltage and channel resistance of the transistor Tr determine the difference (to be referred as dV21 hereinafter) between the readout signal amounts in states "2" and "1".

The following two means are examples of a means for increasing the signal amount difference dV21. The first means is a method of applying a negative substrate biasing potential to the memory cell transistor Tr. This accelerates the substrate biasing effect, further increases the channel resistance, and increases the signal amount difference dV21 as well. The second means makes the potential at the time of activation of the read word line RWL lower than the conventional potential. For example, this means makes the potential at the time of activation of the read word line RWL lower than the power supply potential. This decreases the gate-source potential difference Vgs, and increases the signal amount difference dV21. Note that the combination of the first and second means makes it possible to further increase the signal amount difference dV21, and facilitate the setting of the signal amount difference dV21, thereby facilitating design.

[3-4] Relationship between Readout Signal and Data

Figures 14, 15:
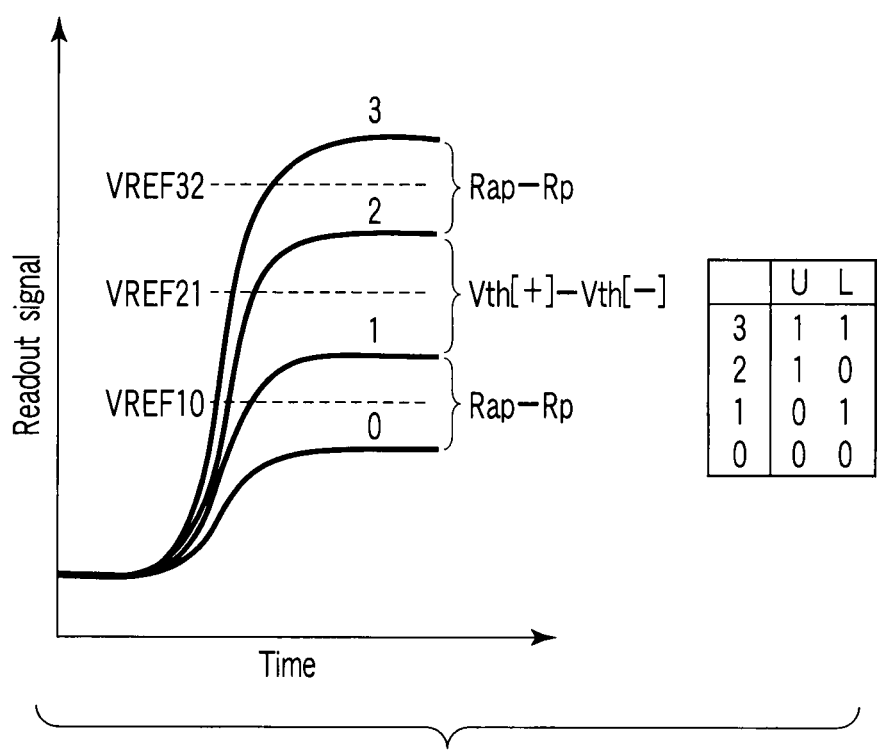
FIG. 14 is a view showing the results of the read operation of the memory cell according to the embodiment of the present invention.
FIG. 15 is a graph showing the relationship between a read signal (potential) and reference potential as two inputs to a sense amplifier in a read circuit according to the embodiment of the present invention.

FIG. 14 is a view showing the results of the read operation of the memory cell according to the embodiment of the present invention. The results of the read operation of the memory cell according to the embodiment of the present invention will be explained below on the basis of the relationship between the readout signal and data.

As shown in FIG. 14, data having $2^3=8$ patterns (Data 0 to 7) are read out by performing the read operation on one memory cell MC. This read operation is performed twice. One is the operation of reading out data from cell portion A (MTJ1 and MTJ3) by activating the read word line RWL<odd> shown in FIG. 11. The other is the operation of reading out data from cell portion B (MTJ2 and MTJ3) by activating the read word line RWL<even> shown in FIG. 11.

An example of Data 0 is the case where the readout signal is in state "0" when data of cell portion A is read out by activating the read word line RWL<odd>, and the readout signal is in state "0" when data of cell portion B is read out by activating the read word line RWL<even>. In this case, all the first, second, and third MTJ elements MTJ1, MTJ2, and MTJ3 are in the low-resistance state Rp (data "0").

An example of Data 1 is the case where the readout signal is in state "1" when data of cell portion A is read out by activating the read word line RWL<odd>, and the readout signal is in state "1" when data of cell portion B is read out by activating the read word line RWL<even>. In this case, the first and second MTJ elements MTJ1 and MTJ2 are in the low-resistance state Rp (data "0"), and the third MTJ element MTJ3 is in the high-resistance state Rap (data "1").

An example of Data 2 is the case where the readout signal is in state "0" when data of cell portion A is read out by activating the read word line RWL<odd>, and the readout signal is in state "2" when data of cell portion B is read out by activating the read word line RWL<even>. In this case, the first and third MTJ elements MTJ1 and MTJ3 are in the low-resistance state Rp (data "0"), and the second MTJ element MTJ2 is in the high-resistance state Rap (data "1").

An example of Data 3 is the case where the readout signal is in state "1" when data of cell portion A is read out by activating the read word line RWL<odd>, and the readout signal is in state "3" when data of cell portion B is read out by activating the read word line RWL<even>. In this case, the first MTJ element MTJ1 is in the low-resistance state Rp (data "0"), and the second and third MTJ elements MTJ2 and MTJ3 are in the high-resistance state Rap (data "1").

An example of Data 4 is the case where the readout signal is in state "2" when data of cell portion A is read out by activating the read word line RWL<odd>, and the readout signal is in state "0" when data of cell portion B is read out by activating the read word line RWL<even>. In this case, the first MTJ element MTJ1 is in the high-resistance state Rap (data "1"), and the second and third MTJ elements MTJ2 and MTJ3 are in the low-resistance state Rap (data "0").

An example of Data 5 is the case where the readout signal is in state "3" when data of cell portion A is read out by activating the read word line RWL<odd>, and the readout signal is in state "1" when data of cell portion B is read out by activating the read word line RWL<even>. In this case, the first and third MTJ elements MTJ1 and MTJ3 are in the high-resistance state Rap (data "1"), and the second MTJ element MTJ2 is in the low-resistance state Rap (data "0").

An example of Data 6 is the case where the readout signal is in state "2" when data of cell portion A is read out by activating the read word line RWL<odd>, and the readout signal is in state "2" when data of cell portion B is read out by activating the read word line RWL<even>. In this case, the first and second MTJ elements MTJ1 and MTJ2 are in the high-resistance state Rap (data "1"), and the third MTJ element MTJ3 is in the low-resistance state Rp (data "0").

An example of Data 7 is the case where the readout signal is in state "3" when data of cell portion A is read out by activating the read word line RWL<odd>, and the readout signal is in state "3" when data of cell portion B is read out by activating the read word line RWL<even>. In this case, all the first, second, and third MTJ elements MTJ1, MTJ2, and MTJ3 are in the high-resistance state Rap (data "1").

Note that in the case of constant voltage application/current read, Isig decreases when the resistance value is H (Rap) and increases when the resistance value is L (Rp). That is, the resistance value and the magnitude of the readout signal (electric current) are inversely proportional. On the other hand, in the case of constant current/voltage read, the resistance value and the readout signal (Vsig: voltage) are proportional.

In the read operation according to the embodiment of the present invention described above, it is assumed that all the first, second, and third MTJ elements MTJ1, MTJ2, and MTJ3 included in the memory cell MC are formed to have equal characteristics. For example, the first, second, and third MTJ elements MTJ1, MTJ2, and MTJ3 have the same MR ratio (the resistance ratio of a maximum resistance value to a minimum resistance value), the same resistance value Rp in the low-resistance state (in which the magnetization directions are parallel), and the same resistance value Rap in the high-resistance state (in which the magnetization directions are antiparallel). However, the present invention is not limited to this case. For example, as disclosed in Jpn. Pat. Appln. KOKAI Publication No. 2003-229547, the characteristics may also be set such that the first and second MTJ elements MTJ1 and MTJ2 have the same resistance value, and the third MTJ element MTJ3 has a resistance value different from that of the first MTJ element MTJ1 (e.g., one resistance value is twice the other). In this case, a signal amount difference dV21 sufficient for the read operation can be ensured without using the effect by which the threshold value and channel resistance of the memory cell transistor Tr1 change in accordance with the resistance value of the first MTJ element MTJ1. Since, however, the first and second MTJ elements MTJ1 and MTJ2 and the third MTJ element MTJ3 require different process steps, it is necessary to allow an increase in lot period or process cost.

[4] Read Circuit

[4-1] Reference Potential of Sense Amplifier

FIG. 15 is a view showing the relationship between the readout signal (potential) and reference potential as two inputs to a sense amplifier in a read circuit according to the embodiment of the present invention. The relationship between the readout signal (potential) and reference potential as two inputs to the sense amplifier in the read circuit according to the embodiment of the present invention will be explained below.

Referring to FIG. 15, readout signals in states "10" to "3" are input signals to the sense amplifier, and the sense amplifier uses reference potentials VREF10, VREF21, and VREF32.

The reference potential VREF10 is set for the readout signals in states "1" and "0". The reference potential VREF21 is set for the readout signals in states "2" and "1". The reference potential VREF32 is set for the readout signals in states "3" and "2". The reference potential VREF10 is desirably a potential intermediate between the readout signals in states "1" and "0". The reference potential VREF21 is desirably a potential intermediate between the readout signals in states "2" and "1". The reference potential VREF32 is desirably a potential intermediate between the readout signals in states "3" and "2".

Note that the reference potential VREF21 is a reference potential for detecting upper-bit signals (U in the table), and the reference potentials VREF32 and VREF10 are reference potentials for detecting lower-bit signals (L in the table).

[4-2] Practical Example 1 of Read Circuit

A read circuit of practical example 1 is an example of an output selection type circuit which has one sense amplifier for upper bit discrimination and two sense amplifiers for lower bit discrimination, and selects output signals from the sense amplifiers for lower bit discrimination in accordance with an output signal from the sense amplifier for upper bit discrimination.

Figure 16:
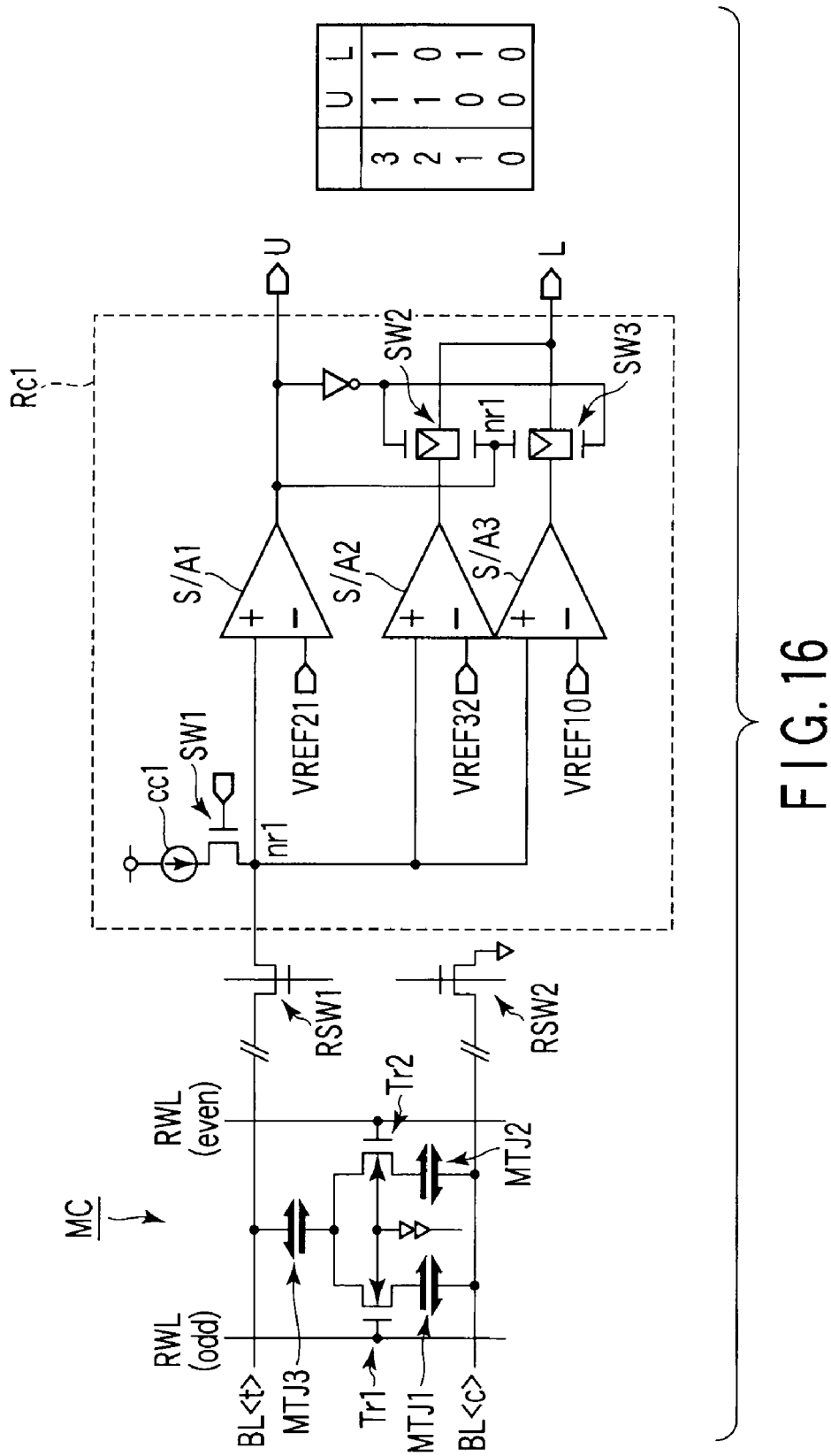
FIG. 16 is a circuit diagram of practical example 1 of a read circuit applied to the memory cell according to the embodiment of the present invention.

FIG. 16 is a circuit diagram showing practical example 1 of the read circuit applied to the memory cell according to the embodiment of the present invention. Practical example 1 of the read circuit according to the embodiment of the present invention will be explained below.

As shown in FIG. 16, the bit lines BL<t> and BL<c> are respectively connected to switching circuits (transfer gates) RSW1 and RSW2 for selecting a predetermined one of the bit lines BL<t> and BL<c> in a read operation. The switching circuits RSWL and RSW2 comprise, e.g., transistors. The switching circuit RSW1 is connected to a read circuit RC1 for reading out data from the memory cell MC. The read circuit RC1 comprises sense amplifiers S/A1, S/A2, and S/A3, a constant current source CC, and switching circuits (transfer gates) SW1, SW2, and SW3. The sense amplifier S/A1 is used for upper bit discrimination, and the sense amplifiers S/A2 and S/A3 are used for lower bit discrimination.

The constant current source CC is connected to one end of the current path of the switching circuit SW1, and the other end of the current path of the switching circuit SW1 is connected to a node nr1. The bit line BL<t> is connected to the node nr1 via the switching circuit RSW1.

All the first input terminals (+) of the sense amplifiers S/A1, S/A2, and S/A3 are connected to the node nr1. Accordingly, a constant current supplied from the constant current source CC is supplied to the memory cell MC, and a readout signal converted from an electric current into a voltage is input to the sense amplifiers S/A1, S/A2, and S/A3. On the other hand, the reference potentials VREF21, VREF32, and VRED10 are respectively input to the second input terminals (−) of the sense amplifiers S/A1, S/A2, and S/A3.

The output terminals of the two sense amplifiers S/A2 and S/A3 for lower bit discrimination are respectively connected to the switching circuits SW2 and SW3. A node nr2 connecting the switching circuits SW2 and SW3 is connected to the output terminal of the sense amplifier S/A1 for upper bit discrimination. In accordance with the upper-bit output signal (U) from the sense amplifier S/A1, therefore, one of the switching circuits SW2 and SW3 is selected, and the lower-bit signal (L) is output.

In this example, ON and OFF of the switching circuits SW2 and SW3 are set such that the switching circuit SW2 is turned on when the upper-bit output signal (U) is data "1", and the switching circuit SW3 is turned on when the upper-bit output signal (U) is data "0".

As described above, practical example 1 is the output selection type read circuit RC1 in which the lower-bit output signals (L) from the sense amplifiers S/A2 and S/A3 are selected in accordance with the upper-bit output signal (U) from the sense amplifier S/A1.

A read operation using the output selection type read circuit RC1 will be explained below by taking the case where the signals from the first and third MTJ elements MTJ1 and MTJ3 are read out as an example. Note that the signal from the first MTJ element MTJ is allocated as the upper-bit signal (U), and the signal from the third MTJ element MTJ3 is allocated as the lower-bit signal (L).

First, the bit line BL<c> is set at, e.g., the ground potential. The read word line RWL<odd> is selected, and the transistor Tr1 is turned on. The switching circuits RSW1 and SW1 are turned on to supply a read current I from the constant current source CC to the memory cell MC. The read current I flows through the first and third MTJ elements MTJ1 and MTJ3, and a readout signal S converted from an electric current into a voltage is input to the sense amplifiers S/A1, S/A2, and S/A3.

The sense amplifier S/A1 discriminates the data of the first MTJ element MTJ1 as the upper bit. That is, if the readout signal S is higher than the reference potential VREF21, the first and third MTJ elements MTJ1 and MTJ3 are in state "3" or "2" shown in FIG. 15, so the data of the first MTJ element MTJ1 is discriminated as data "1". On the other hand, if the readout signal S is lower than the reference potential VREF21, the first and third MTJ elements MTJ1 and MTJ3 are in state "1" or "0" shown in FIG. 15, so the data of the first MTJ element MTJ1 is discriminated as data "0". A signal (U) based on this discrimination is output as a first output signal of the read circuit RC1 from the output terminal of the sense amplifier S/A1.

If the first MTJ element MTJ1 has data "1" (e.g., state "H"), the upper-bit output signal (U) turns on the switching circuit SW2 to output the discrimination result from the sense amplifier S/A2. The sense amplifier S/A2 discriminates the data of the third MTJ element MTJ3 as the lower bit. That is, if the readout signal S is higher than the reference potential VREF32, the first and third MTJ elements MTJ1 and MTJ3 are in state "3" shown in FIG. 15, so the data of the third MTJ element MTJ3 is discriminated as data "1". On the other hand, if the readout signal S is lower than the reference potential VREF32, the first and third MTJ elements MTJ1 and MTJ3 are in state "2" shown in FIG. 15, so the data of the third MTJ element MTJ3 is discriminated as data "0". A signal (L) based on this discrimination is output as a second output signal of the read circuit RC1 from the output terminal of the sense amplifier S/A2 via the switching circuit SW2.

If the first MTJ element MTJ1 has data "0" (e.g., state "L"), the upper-bit output signal (U) turns on the switching circuit SW3 to output the discrimination result from the sense amplifier S/A3. The sense amplifier S/A3 discriminates the data of the third MTJ element MTJ3 as the lower bit. That is, if the readout signal S is higher than the reference potential VREF10, the first and third MTJ elements MTJ1 and MTJ3 are in state "1" shown in FIG. 15, so the data of the third MTJ element MTJ3 is discriminated as data "1". On the other hand, if the readout signal S is lower than the reference potential VREF10, the first and third MTJ elements MTJ1 and MTJ3 are in state "0" shown in FIG. 15, so the data of the third MTJ element MTJ3 is discriminated as data "0". A signal (L) based on this discrimination is output as a second output signal of the read circuit RC1 from the output terminal of the sense amplifier S/A3 via the switching circuit SW3.

[4-3] Practical Example 2 of Read Circuit

A read circuit of practical example 2 is an example of an input selection type circuit which has one sense amplifier for upper bit discrimination and one sense amplifier for lower bit discrimination, and selects a reference signal from the sense amplifier for lower bit discrimination in accordance with an output signal from the sense amplifier for upper bit discrimination. Compared to practical example 1 having three sense amplifiers described above, practical example 2 has the effect of, e.g., reducing the chip area since the number of sense amplifiers can be decreased to two.

Figure 17:
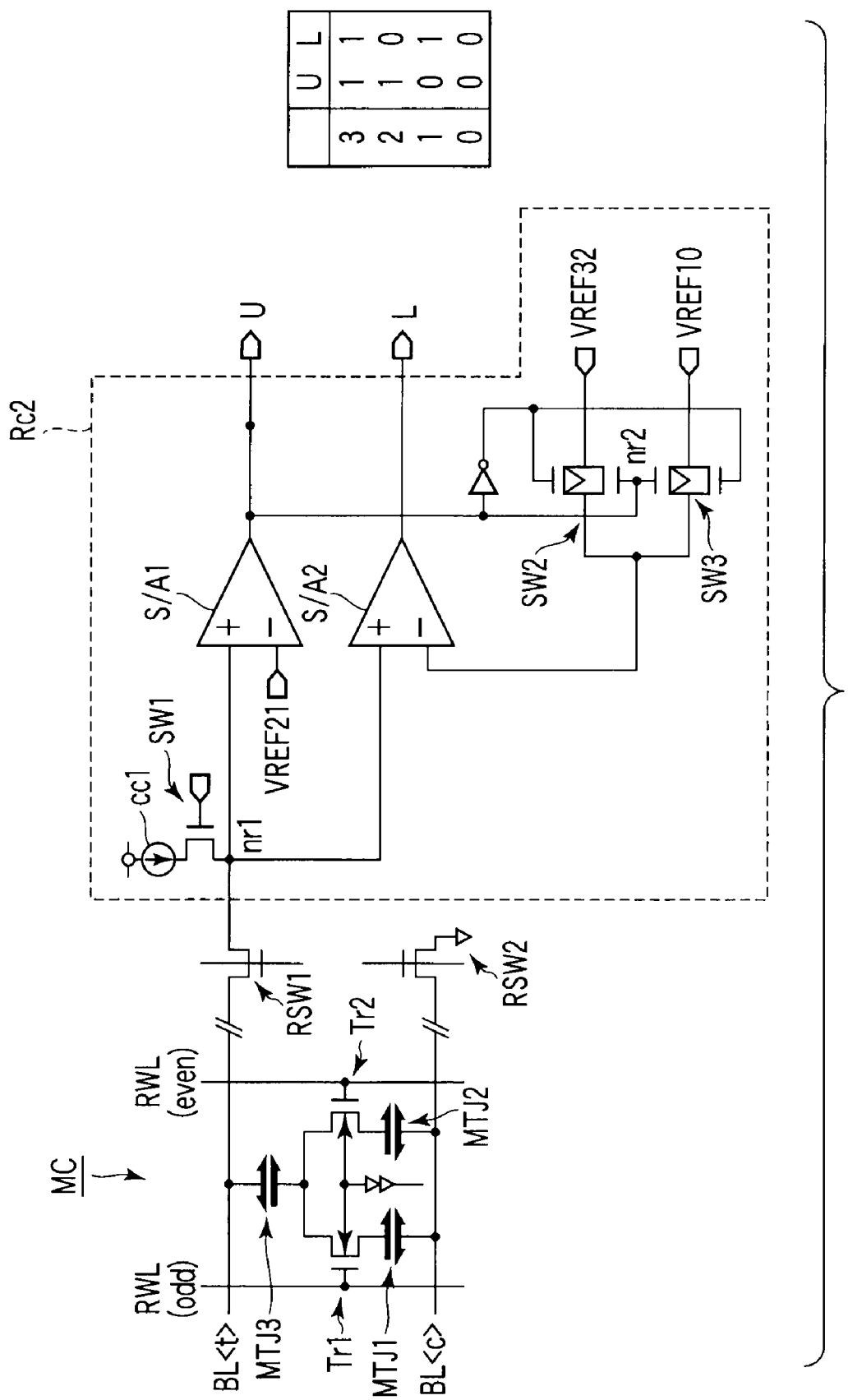
FIG. 17 is a circuit diagram of practical example 2 of the read circuit applied to the memory cell according to the embodiment of the present invention.

FIG. 17 is a circuit diagram showing practical example 2 of the read circuit applied to the memory cell according to the embodiment of the present invention. Practical example 2 of the read circuit according to the embodiment of the present invention will be explained below.

As shown in FIG. 17, practical example 2 differs from practical example 1 in that a sense amplifier S/A2 alone is used for lower bit discrimination, and a reference signal of the sense amplifier S/A2 is selected in accordance with an upper-bit signal (U).

That is, a read circuit RC2 of practical example 2 comprises a sense amplifier S/A1, the sense amplifier S/A2, a constant current source CC, and switching circuits SW1, SW2, and SW3. The sense amplifier S/A1 is used for upper bit discrimination, and the sense amplifier S/A2 is used for lower bit discrimination.

Both the first input terminals (+) of the sense amplifiers S/A1 and S/A2 are connected to a node nr1. Accordingly, a constant current supplied from the constant current source CC is supplied to the memory cell MC, and a readout signal converted from an electric current into a voltage is input to the sense amplifiers S/A1 and S/A2. The reference potential VREF21 is input to the second input terminal (−) of the sense amplifier S/A1. The second input terminal (−) of the sense amplifier S/A2 is connected to the switching circuits SW2 and SW3. One of the reference potentials VREF32 and VREF10 is input to the second input terminal (−) of the sense amplifier S/A2 in accordance with ON/OFF of the switching circuits SW2 and SW3.

A node nr2 connecting the switching circuits SW2 and SW3 is connected to the output terminal of the sense amplifier S/A1 for upper bit discrimination. In accordance with the upper-bit output signal (U) from the sense amplifier S/A1, therefore, one of the switching circuits SW2 and SW3 is selected, and one of the reference signals VREF32 and VREF10 is input to the second input terminal (−) of the sense amplifier S/A2.

In this example, ON and OFF of the switching circuits SW2 and SW3 are set such that the switching circuit SW2 is turned on when the upper-bit output signal (U) is data "1", and the switching circuit SW3 is turned on when the upper-bit output signal (U) is data "0".

As described above, practical example 2 is the input selection type read circuit RC2 in which the input signal (−) of the sense amplifier S/A2 is selected in accordance with the upper-bit output signal (U) from the sense amplifier S/A1.

A read operation using the input selection type read circuit RC2 will be explained below by taking the case where the signals from the first and third MTJ elements MTJ1 and MTJ3 are read out as an example. Note that the signal from the first MTJ element MTJ1 is allocated as the upper-bit signal (U), and the signal from the third MTJ element MTJ3 is allocated as the lower-bit signal (L).

First, the bit line BL<c> is set at, e.g., the ground potential. The read word line RWL<odd> is selected, and the transistor Tr1 is turned on. The switching circuit RSW1 and switching circuit SW1 are turned on to supply the read current I from the constant current source CC to the memory cell MC. The read current I flows through the first and third MTJ elements MTJ1 and MTJ3, and the readout signal S converted from an electric current into a voltage is input to the sense amplifiers S/A1 and S/A2.

The sense amplifier S/A1 discriminates the data of the first MTJ element MTJ1 as the upper bit. That is, if the readout signal S is higher than the reference potential VREF21, the first and third MTJ elements MTJ1 and MTJ3 are in state "3" or "2" shown in FIG. 15, so the data of the first MTJ element MTJ1 is discriminated as data "1". On the other hand, if the readout signal S is lower than the reference potential VREF21, the first and third MTJ elements MTJ1 and MTJ3 are in state "1" or "0" shown in FIG. 15, so the data of the first MTJ element MTJ1 is discriminated as data "0". A signal (U) based on this discrimination is output as a first output signal of the read circuit RC2 from the output terminal of the sense amplifier S/A1.

If the first MTJ element MTJ1 has data "1" (e.g., state "H"), the upper-bit output signal (U) turns on the switching circuit SW2 to input the reference potential VREF32 to the second input terminal (−) of the sense amplifier S/A2. The sense amplifier S/A2 discriminates the data of the third MTJ element MTJ3 as the lower bit. That is, if the readout signal S is higher than the reference potential VREF32, the first and third MTJ elements MTJ1 and MTJ3 are in state "3" shown in FIG. 15, so the data of the third MTJ element MTJ3 is discriminated as data "1". On the other hand, if the readout signal S is lower than the reference potential VREF32, the first and third MTJ elements MTJ1 and MTJ3 are in state "2" shown in FIG. 15, so the data of the third MTJ element MTJ3 is discriminated as data "0". A signal (L) based on this discrimination is output as a second output signal of the read circuit RC2 from the output terminal of the sense amplifier S/A2.

If the first MTJ element MTJ1 has data "0" (e.g., state "L"), the upper-bit output signal (U) turns on the switching circuit SW3 to input the reference potential VREF10 to the second input terminal (−) of the sense amplifier S/A2. The sense amplifier S/A2 discriminates the data of the third MTJ element MTJ3 as the lower bit. That is, if the readout signal S is higher than the reference potential VREF10, the first and third MTJ elements MTJ1 and MTJ3 are in state "1" shown in FIG. 15, so the data of the third MTJ element MTJ3 is discriminated as data "1". On the other hand, if the readout signal S is lower than the reference potential VREF10, the first and third MTJ elements MTJ1 and MTJ3 are in state "0" shown in FIG. 15, so the data of the third MTJ element MTJ3 is discriminated as data "0". A signal (L) based on this discrimination is output as the second output signal of the read circuit RC2 from the output terminal of the sense amplifier S/A2.

Note that in practical example 2, the sense amplifier S/A2 for lower bit discrimination is desirably activated after the sense amplifier S/A1 for upper bit discrimination operates to determine its discrimination, and the selected reference potential VREF32 or VREF10 is transferred to the sense amplifier S/A2 for lower bit discrimination. That is, it is desirable to use different activation signals for the sense amplifier S/A1 for upper bit discrimination and the sense amplifier S/A2 for lower bit discrimination, and perform control such that the sense amplifier S/A2 operates after the sense amplifier S/A1 operates.

In practical examples 1 and 2, the substrate biasing potential of the memory cell transistors Tr1 and Tr2 is set at a negative potential because it can be adjusted more easily than the ground potential. However, this substrate biasing potential can also be set at the ground potential.

[5] Effects

In the spin injection type magnetic random access memory according to the embodiment of the present invention, one memory cell comprises 2T+3MTJ, and stores information of 3 bits ($2^3$=8 values). The area of this 2T+3MTJ memory cell is $16F^2$. Accordingly, a memory cell size per bit is practically $16F^2/3$, i.e., about $5.3F^2$. Therefore, the memory cell size per unit bit can be reduced by about 33.3% when compared to the conventional memory cell size ($8F^2$). This makes it possible to reduce the chip area, and implement a low-cost, large-capacity spin injection type MRAM.

The write operation of the spin injection type magnetic random access memory according to the embodiment of the present invention can write different data in three MTJ elements of the 2T+3MTJ memory cell.

The read operation of the spin injection type magnetic random access memory according to the embodiment of the present invention can simultaneously read out 2-bit information by one read operation, and can read out 3-bit information by two read operations. Accordingly, a high-speed read operation can be achieved by the same memory cell size as that of the conventional device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first resistive memory element, a second resistive memory element, and a third resistive memory element forming a first memory cell;
a first transistor having a first gate electrode, a first source/drain electrode, and a second source/drain electrode, the first source/drain electrode being connected to one terminal of the first resistive memory element, and the second source/drain electrode being connected to one terminal of the third resistive memory element;
a second transistor having a second gate electrode, a third source/drain electrode, and a fourth source/drain electrode, the third source/drain electrode being connected to one terminal of the second resistive memory element, and the fourth source/drain electrode being connected to one terminal of the third resistive memory element;
a first bit line connected to the other terminal of the third resistive memory element;
a second bit line connected to the other terminal of each of the first resistive memory element and the second resistive memory element;
a first word line connected to the first gate electrode; and
a second word line connected to the second gate electrode.

2. The device according to claim 1, which further comprises:
a fourth resistive memory element, a fifth resistive memory element, and a sixth resistive memory element forming a second memory cell adjacent to the first memory cell;
a third transistor having a third gate electrode, a fifth source/drain electrode, and a sixth source/drain electrode, the fifth source/drain electrode being connected to one terminal of the fourth resistive memory element, and the sixth source/drain electrode being connected to one terminal of the sixth resistive memory element;
a fourth transistor having a fourth gate electrode, a seventh source/drain electrode, and an eighth source/drain electrode, the seventh source/drain electrode being connected to one terminal of the fifth resistive memory element, and the eighth source/drain electrode being connected to one terminal of the sixth resistive memory element;
a third word line connected to the third gate electrode; and
a fourth word line connected to the fourth gate electrode, and
in which the other terminal of each of the fourth resistive memory element and the fifth resistive memory element is connected to the first bit line, and the other terminal of the sixth resistive memory element is connected to the second bit line.

3. The device according to claim 1, wherein
the first bit line and the second bit line are adjacent to each other, and run in the same direction,
the first word line and the second word line are adjacent to each other, and intersect the first bit line and the second bit line;
the second source/drain electrode and the fourth source/drain electrode are formed between the first word line and the second word line, and made of a common diffusion layer shared by the first transistor and the second transistor,
the first source/drain electrode and the common diffusion layer sandwich the first word line therebetween,
the first source/drain electrode is formed below the second bit line,
at least a portion of the common diffusion layer is formed below the second bit line,
the third source/drain electrode and the common diffusion layer are formed below the second bit line to sandwich the second word line therebetween,
the first resistive memory element is formed below the second bit line above the first source/drain electrode,
the second resistive memory element is formed below the second bit line above the third source/drain electrode, and
the third resistive memory element is formed below the first bit line between the first word line and the second word line.

4. The device according to claim 3, wherein the first bit line and the second bit line are formed by the same layer.

5. The device according to claim 1, wherein
the first resistive memory element has a first fixed layer in which a magnetization direction is fixed, a first recording layer in which a magnetization direction is variable, and a first insulating layer formed between the first fixed layer and the first recording layer,
the second resistive memory element has a second fixed layer in which a magnetization direction is fixed, a second recording layer in which a magnetization direction is variable, and a second insulating layer formed between the second fixed layer and the second recording layer,
the third resistive memory element has a third fixed layer in which a magnetization direction is fixed, a third recording layer in which a magnetization direction is variable, and a third insulating layer formed between the third fixed layer and the third recording layer, and
the first resistive memory element, the second resistive memory element, and the third resistive memory element have one of an arrangement in which the first fixed layer is connected to the first source/drain electrode, the second fixed layer is connected to the third source/drain electrode, the third fixed layer is connected to the second source/drain electrode and the fourth source/drain electrode as the common diffusion layer, the first recording layer and the second recording layer are connected to the second bit line, and the third recording layer is connected to the first bit line, and an arrangement in which the first recording layer is connected to the first source/drain electrode, the second recording layer is connected to the third source/drain electrode, the third recording layer is connected to the second source/drain electrode and the fourth source/drain electrode as the common diffusion layer, the first fixed layer and the second fixed layer are connected to the second bit layer, and the third fixed layer is connected to the first bit line.

6. The device according to claim 1, wherein the first resistive memory element, the second resistive memory element, and the third resistive memory element have different resistance values corresponding to stored data, and a resistance ratio of a maximum resistance value to a minimum resistance value of the first resistive memory element, a resistance ratio of a maximum resistance value to a minimum resistance value of the second resistive memory element, and a resistance ratio of a maximum resistance value to a minimum resistance value of the third resistive memory element are equal.

7. The device according to claim 1, wherein a substrate biasing potential of the first transistor and the second transistor is a negative potential.

8. The device according to claim 1, wherein each of the first resistive memory element, the second resistive memory element, and the third resistive memory element is a tunneling magnetoresistive element having a fixed layer in which a magnetization direction is fixed, a recording layer in which a magnetization direction is variable, and an insulating layer formed between the fixed layer and the recording layer, and the magnetization direction in the recording layer is reversed by supplying a write current equal to or larger than a magnetization reversing threshold current to the tunneling magnetoresistive element, and relative magnetization directions in the fixed layer and the recording layer are set in one of a parallel state and an antiparallel state in accordance with a direction of the write current, thereby changing a resistance value of the tunneling magnetoresistive element by the relative magnetization directions.

9. A data write method of a semiconductor memory device including:

a first resistive memory element, a second resistive memory element, and a third resistive memory element forming a first memory cell;

a first transistor having a first gate electrode, a first source/drain electrode, and a second source/drain electrode, the first source/drain electrode being connected to one terminal of the first resistive memory element, and the second source/drain electrode being connected to one terminal of the third resistive memory element;

a second transistor having a second gate electrode, a third source/drain electrode, and a fourth source/drain electrode, the third source/drain electrode being connected to one terminal of the second resistive memory element, and the fourth source/drain electrode being connected to one terminal of the third resistive memory element;

a first bit line connected to the other terminal of the third resistive memory element;

a second bit line connected to the other terminal of each of the first resistive memory element and the second resistive memory element;

a first word line connected to the first gate electrode; and a second word line connected to the second gate electrode, and the data write method comprising:

a first write operation of supplying a first write current to the first resistive memory element and the third resistive memory element by turning on the first transistor, and simultaneously writing data corresponding to a direction of the first write current in the first resistive memory element and the third resistive memory element; and a second write operation of supplying a second write current to the second resistive memory element and the third resistive memory element by turning on the second transistor, and simultaneously writing data corresponding to a direction of the second write current in the second resistive memory element and the third resistive memory element.

10. The method according to claim 9, further comprising a third write operation of supplying a third write current to the third resistive memory element and supplying a divided current of the third write current to each of the first resistive memory element and the second resistive memory element by turning on both the first transistor and the second transistor, and writing data corresponding to a direction of the third write current in only the third resistive memory element.

11. The method according to claim 9, wherein write to the first resistive memory element, the second resistive memory element, and the third resistive memory element is complete by the first write operation and the second write operation, and polarity of the data to be written in the third resistive memory element determines an order of the first write operation and the second write operation.

12. The method according to claim 9, wherein the first resistive memory element has a first fixed layer in which a magnetization direction is fixed, a first recording layer in which a magnetization direction is variable, and a first insulating layer formed between the first fixed layer and the first recording layer, the second resistive memory element has a second fixed layer in which a magnetization direction is fixed, a second recording layer in which a magnetization direction is variable, and a second insulating layer formed between the second fixed layer and the second recording layer, the third resistive memory element has a third fixed layer in which a magnetization direction is fixed, a third recording layer in which a magnetization direction is variable, and a third insulating layer formed between the third fixed layer and the third recording layer, the first resistive memory element, the second resistive memory element, and the third resistive memory element have one of an arrangement in which the first fixed layer is connected to the first source/drain electrode, the second fixed layer is connected to the third source/drain electrode, the third fixed layer is connected to the second source/drain electrode and the fourth source/drain electrode as the common diffusion layer, the first recording layer and the second recording layer are connected to the second bit line, and the third recording layer is connected to the first bit line, and an arrangement in which the first recording layer is connected to the first source/drain electrode, the second recording layer is connected to the third source/drain electrode, the third recording layer is connected to the second source/drain electrode and the fourth source/drain electrode as the common diffusion layer, the first fixed layer and the second fixed layer are connected to the second bit layer, and the third fixed layer is connected to the first bit line, data opposite to that of the first resistive memory element is written in the third resistive memory element in the first write operation, data opposite to that of the second resistive memory element is written in the third resistive memory element in the second write operation, the data to be written in the third resistive memory element is determined in accordance with the direction of the second write current, and the third resistive memory element functions as a replica element of opposite polarity data of one of the first resistive memory element and the second resistive memory element.

13. The method according to claim 12, wherein the second write operation is performed after the first write operation.

14. A data read method of a semiconductor memory device including:

a first resistive memory element, a second resistive memory element, and a third resistive memory element forming a first memory cell;

a first transistor having a first gate electrode, a first source/drain electrode, and a second source/drain electrode, the first source/drain electrode being connected to one terminal of the first resistive memory element, and the second source/drain electrode being connected to one terminal of the third resistive memory element;

a second transistor having a second gate electrode, a third source/drain electrode, and a fourth source/drain electrode, the third source/drain electrode being connected to one terminal of the second resistive memory element, and the fourth source/drain electrode being connected to one terminal of the third resistive memory element;

a first bit line connected to the other terminal of the third resistive memory element;

a second bit line connected to the other terminal of each of the first resistive memory element and the second resistive memory element;

a first word line connected to the first gate electrode;

a second word line connected to the second gate electrode; and a read circuit connected to one of the first bit line and the second bit line, and the data read method comprising:

a first read operation of simultaneously reading out data from the first resistive memory element and the third resistive memory element by activating the first word line; and a second read operation of simultaneously reading out data from the second resistive memory element and the third resistive memory element by activating the second word line.

15. The method according to claim 14, wherein in the first read operation, the data of the first resistive memory element and the third resistive memory element are discriminated by reading out a synthetic resistance obtained by a series connection of the first resistive memory element, the third resistive memory element, and a channel resistance of the first transistor, and in the second read operation, the data of the second resistive memory element and the third resistive memory element are discriminated by reading out a synthetic resistance obtained by a series connection of the second resistive memory element, the third resistive memory element, and a channel resistance of the second transistor.

16. The method according to claim 14, wherein the read circuit has a first sense amplifier, a second sense amplifier, a third sense amplifier, a constant current source, a first switching circuit, and a second switching circuit, the constant current source is connected to the first bit line or the second bit line via a transfer gate, first input terminals of the first sense amplifier, the second sense amplifier, and the third sense amplifier are connected together to one of the first bit line and the second bit line, a first reference potential is input to a second input terminal of the first sense amplifier, a second reference potential is input to a second input terminal of the second sense amplifier, a third reference potential is input to a second input terminal of the third sense amplifier, the second reference potential is higher than the first reference potential, the third reference potential is lower than the first reference potential, an output terminal of the first sense amplifier is a first output terminal of the read circuit, an output terminal of the second sense amplifier is connected to one terminal of the first switching circuit, an output terminal of the third sense amplifier is connected to one terminal of the second switching circuit, the other terminal of the first switching circuit and the other terminal of the second switching circuit are connected together as a second output terminal of the read circuit, and an output signal from the first sense amplifier controls the first switching circuit and the second switching circuit, thereby outputting an output signal from one of the second sense amplifier and the third sense amplifier.

17. The method according to claim 14, wherein the read circuit has a first sense amplifier, a second sense amplifier, a constant current source, a first switching circuit, and a second switching circuit, the constant current source is connected to the first bit line or the second bit line via a transfer gate, first input terminals of the first sense amplifier and the second sense amplifier are connected together to one of the first bit line and the second bit line, a first reference potential is input to a second input terminal of the first sense amplifier, a second reference potential is input to one terminal of the first switching circuit, a third reference potential is input to one terminal of the second switching circuit, the other terminal of the first switching circuit and the other terminal of the second switching circuit are connected together to a second output terminal of the second sense amplifier, the second reference potential is higher than the first reference potential, the third reference potential is lower than the first reference potential, an output terminal of the first sense amplifier is a first output terminal of the read circuit, an output terminal of the second sense amplifier is a second output terminal of the read circuit, and an output signal from the first sense amplifier controls the first switching circuit and the second switching circuit, thereby inputting one of the second reference potential and the third reference potential to the second sense amplifier.

18. The method according to claim 17, wherein the second sense amplifier is activated after one of the second reference potential and the third reference potential is input to the second sense amplifier.

19. The method according to claim 14, wherein in at least one of the first read operation and the second read operation, a substrate biasing potential of the first transistor and the second transistor is set at a negative potential.

20. The method according to claim 14, wherein a potential when the first word line and the second word line are activated is lower than a power supply potential.

* * * * *